United States Patent
Shiraishi

(10) Patent No.: US 8,638,422 B2
(45) Date of Patent: Jan. 28, 2014

(54) EXPOSURE METHOD, EXPOSURE APPARATUS, METHOD FOR PRODUCING DEVICE, AND METHOD FOR EVALUATING EXPOSURE APPARATUS

(75) Inventor: Kenichi Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 266 days.

(21) Appl. No.: 11/886,506

(22) PCT Filed: Mar. 17, 2006

(86) PCT No.: PCT/JP2006/005345
§ 371 (c)(1),
(2), (4) Date: Oct. 23, 2007

(87) PCT Pub. No.: WO2006/101024
PCT Pub. Date: Sep. 28, 2006

(65) Prior Publication Data
US 2008/0212056 A1    Sep. 4, 2008

(30) Foreign Application Priority Data

Mar. 18, 2005 (JP) ................. 2005-079110

(51) Int. Cl.
*G03B 27/32* (2006.01)
*G03B 27/42* (2006.01)
*G03B 27/52* (2006.01)
*G03B 27/58* (2006.01)
*G03C 5/00* (2006.01)

(52) U.S. Cl.
USPC .................... 355/77; 355/30; 355/53; 355/72

(58) Field of Classification Search
USPC ........... 250/492.2; 355/30, 53, 55, 72, 77, 75; 356/399–401; 430/30
See application file for complete search history.

(56) References Cited

U.S. PATENT DOCUMENTS

| | | | |
|---|---|---|---|
| 4,346,164 | A | 8/1982 | Tabarelli et al. |
| 4,480,910 | A | 11/1984 | Takanashi et al. |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Supplementary European Search Report for Application No. EP 06 72 9335 dated May 11, 2010.

(Continued)

*Primary Examiner* — Toan Ton
*Assistant Examiner* — Colin Kreutzer
(74) *Attorney, Agent, or Firm* — Oliff & Berridge, PLC

(57) ABSTRACT

An exposure method includes a first step for measuring position information of a substrate while controlling a substrate stage to move the substrate stage in a state that an optical path space is filled with a liquid under a predetermined condition; a second step for obtaining a movement control accuracy of the substrate stage based on a result of the measurement; a third step for determining an exposure condition, for exposing the substrate, based on the obtained movement control accuracy; and a fourth step for exposing the substrate based on the determined exposure condition. This makes it possible to satisfactorily expose the substrate at the time of exposing the substrate based on the liquid immersion method.

60 Claims, 13 Drawing Sheets

(56) References Cited

U.S. PATENT DOCUMENTS

| | | | |
|---|---|---|---|
| 5,610,683 | A | 3/1997 | Takahashi |
| 5,715,039 | A | 2/1998 | Fukuda et al. |
| 5,798,195 | A | 8/1998 | Nishi |
| 5,825,043 | A | 10/1998 | Suwa |
| 5,969,441 | A | 10/1999 | Loopstra et al. |
| 6,208,407 | B1 | 3/2001 | Loopstra |
| 6,327,025 | B1 | 12/2001 | Imai |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,721,034 | B1 | 4/2004 | Horikawa |
| 6,778,257 | B2 | 8/2004 | Bleeker et al. |
| 6,897,963 | B1 | 5/2005 | Taniguchi et al. |
| 2002/0100012 | A1 | 7/2002 | Sutani et al. |
| 2004/0165159 | A1 | 8/2004 | Lof et al. |
| 2005/0007569 | A1 | 1/2005 | Streefkerk et al. |
| 2005/0046813 | A1 | 3/2005 | Streefkerk et al. |
| 2005/0248744 | A1 | 11/2005 | Shibazaki |
| 2006/0023184 | A1* | 2/2006 | Coon et al. ............. 355/53 |
| 2006/0028630 | A1 | 2/2006 | Akimoto |
| 2006/0066826 | A1* | 3/2006 | Luijten et al. ............. 355/53 |
| 2006/0098177 | A1 | 5/2006 | Nagasaka |
| 2007/0081133 | A1* | 4/2007 | Kayama et al. ............. 355/53 |
| 2009/0316121 | A1* | 12/2009 | Janssen et al. ............. 355/30 |

FOREIGN PATENT DOCUMENTS

| | | | | |
|---|---|---|---|---|
| EP | 1 420 298 A2 | 5/2004 | | |
| EP | 1 632 991 A1 | 3/2006 | | |
| JP | A 58-202448 | 11/1983 | | |
| JP | A 59-19912 | 2/1984 | | |
| JP | A 62-65326 | 3/1987 | | |
| JP | A 63-157419 | 6/1988 | | |
| JP | A 4-305913 | 10/1992 | | |
| JP | A 4-305917 | 10/1992 | | |
| JP | A 5-62877 | 3/1993 | | |
| JP | A 6-124873 | 5/1994 | | |
| JP | A 7-99148 | 4/1995 | | |
| JP | A 7-220990 | 8/1995 | | |
| JP | A 8-37149 | 2/1996 | | |
| JP | A 8-130179 | 5/1996 | | |
| JP | A 8-316125 | 11/1996 | | |
| JP | A 10-163099 | 6/1998 | | |
| JP | A 10-214783 | 8/1998 | | |
| JP | A 10-303114 | 11/1998 | | |
| JP | A 10-340846 | 12/1998 | | |
| JP | A-11-67655 | 3/1999 | | |
| JP | A 11-102061 | 4/1999 | | |
| JP | A-11-102061 | 4/1999 | | |
| JP | A 11-135400 | 5/1999 | | |
| JP | A 11-176727 | 7/1999 | | |
| JP | A 11-354420 | 12/1999 | | |
| JP | A 2000-58436 | 2/2000 | | |
| JP | A 2000-505958 | 5/2000 | | |
| JP | A 2000-164504 | 6/2000 | | |
| JP | A 2001-510577 | 7/2001 | | |
| JP | A 2002-221783 | 8/2002 | | |
| JP | A 2004-519850 | 7/2004 | | |
| JP | A-2005-50900 | 2/2005 | | |
| JP | A 2005-50900 | 2/2005 | | |
| JP | A 2006-49644 | 2/2006 | | |
| WO | WO 99/08315 | 2/1999 | | |
| WO | WO 9908315 A1 * | 2/1999 | ............. | H01L 21/027 |
| WO | WO 99/28790 A1 | 6/1999 | | |
| WO | WO 99/49504 A1 | 9/1999 | | |
| WO | WO 01/35168 A1 | 5/2001 | | |
| WO | WO 2004/105106 A1 | 2/2004 | | |
| WO | WO 2004/019128 A2 | 3/2004 | | |
| WO | WO 2004/055803 A1 | 7/2004 | | |
| WO | WO 2004/057590 A1 | 7/2004 | | |
| WO | WO 2004/073053 A1 | 8/2004 | | |
| WO | WO 2004093159 A2 * | 10/2004 | | |
| WO | WO 2005/029559 A1 | 3/2005 | | |
| WO | WO 2005/057635 A1 | 6/2005 | | |
| WO | WO 2005057635 A1 * | 6/2005 | ............. | H01L 21/027 |
| WO | WO 2005078777 A1 * | 8/2005 | ............. | H01L 21/027 |

OTHER PUBLICATIONS

Written Opinion issued in Application No. PCT/JP2006/305345 on Jun. 20, 2006 (with English translation).
International Search Report issued in Application No. PCT/JP2006/305345 on Jun. 20, 2006.
Aug. 2, 2011 Office Action issued in Japanese Patent Application No. 2006-074863 with English translation.
May 28, 2013 Office Action issued in Japanese Patent Application No. 2011-219293 (with English Translation).

* cited by examiner (A)

(B)

(A)

(B)

(A)

(B)

SCANNING EXPOSURE DIRECTION

EXPOSURE METHOD, EXPOSURE APPARATUS, METHOD FOR PRODUCING DEVICE, AND METHOD FOR EVALUATING EXPOSURE APPARATUS

TECHNICAL FIELD

The present invention relates to an exposure method and an exposure apparatus which expose a substrate through a liquid, a method for producing device, and an method for evaluating exposure apparatus.

BACKGROUND ART

In the photolithography process as a process for producing a micro device (electronic device, etc.) such as a semiconductor device, a liquid crystal display device and the like, an exposure apparatus which transfers a pattern formed on a mask onto a photosensitive substrate is used. This exposure apparatus includes a mask stage which is movable while holding a mask and a substrate stage which is movable while holding a substrate, and projects an image of a pattern on a mask onto a substrate while successively moving the mask stage and the substrate stage. In the production of micro device, for higher densification (integration) of the device, there has been a demand to miniaturize the pattern to be formed on the substrate. To meet this demand, higher resolution of the exposure apparatus has been desired. As one of the means for realizing such higher resolution in the exposure apparatus, a liquid immersion exposure apparatus, as disclosed in Pamphlet of International Publication No. 99/49504, has been suggested which exposes a substrate in a state that an optical path space for an exposure light beam is filled with a liquid.

SUMMARY OF THE INVENTION

Problem to be Solved by the Present Invention

In a liquid immersion exposure apparatus, when a substrate is exposed while moving a substrate stage in a state that an optical path space for an exposure light beam is filled with a liquid, there is a possibility that the liquid influences the movement control accuracy of the substrate stage. If the movement control accuracy of the substrate stage is deteriorated by the liquid, there is a possibility that the substrate cannot be exposed satisfactorily.

The present invention has been made taking the foregoing circumstances into consideration, and an object thereof is to provide an exposure method and an exposure apparatus which can satisfactorily expose a substrate based on the liquid immersion method, and to provide a method for producing device. Another object of the present invention is to provide an evaluating method for evaluating control accuracy of the exposure apparatus which exposes the substrate based on the liquid immersion method.

Means for Solving the Problem

To solve the above-described problem, the present invention adopts the following constructions.

According to a first aspect of the present invention, there is provided an exposure method for exposing a substrate while moving the substrate held on a substrate stage with respect to an exposure light beam in a state that an optical path space for the exposure light beam is filled with a liquid, the exposure method comprising:

a first step for measuring position information of the substrate held on the substrate stage while controlling the substrate stage to move the substrate stage in a state that the optical path space is filled with the liquid under a predetermined condition;

a second step for obtaining movement control accuracy of the substrate stage based on a result of the measurement;

a third step for determining, based on the obtained movement control accuracy, an exposure condition to be used upon exposing the substrate; and a fourth step for exposing the substrate based on the determined exposure condition.

According to the first aspect of the present invention, movement control accuracy of the substrate stage is obtained by measuring position information of the substrate held on the substrate stage while moving the substrate stage in a state that the optical path space for the exposure light beam is filled with the liquid under a predetermined condition, and an optimal exposure condition can be determined based on the obtained movement control accuracy. Then, based on the determined exposure condition, the substrate can be satisfactorily exposed.

According to a second aspect of the present invention, there is provided an exposure apparatus which exposes a substrate through a liquid while filling a predetermined optical path space for an exposure light beam with the liquid, the exposure apparatus comprising:

a substrate stage which moves the substrate while holding the substrate in a state that the optical path space is filled with the liquid under a predetermined condition;

a control unit which controls movement of the substrate stage; and a measuring unit which measures position information of the substrate held by the substrate stage;

wherein the control unit obtains movement control accuracy of the substrate stage based on the position information of the substrate measured by the measuring unit when the substrate is being moved by the substrate stage, and the control unit determines an exposure condition based on the obtained movement control accuracy.

According to the second aspect of the present invention, the substrate can be satisfactorily exposed based on the liquid immersion method. In particular, even when the optical path space is filled with a liquid, an optimal exposure condition can be determined based on the obtained movement control accuracy.

According to a third aspect of the present invention, there is provided a method for producing a device using the exposure method or exposure apparatus of the above-described aspect. According to the third aspect, a device can be produced by using the exposure method or the exposure apparatus which can satisfactorily expose the substrate based on the liquid immersion method.

According to a fourth aspect of the present invention, there is provided an evaluation method for evaluating control accuracy of an exposure apparatus which has a substrate stage capable of moving a substrate and which exposes the substrate while moving the substrate with respect to an exposure light beam in a state that an optical path space for the exposure light beam is filled with a liquid, the method comprising:

a first step for measuring position information of the substrate while controlling the substrate stage to move the substrate stage in a state that the optical path space is filled with a liquid under a predetermined condition; and a second step for evaluating movement control accuracy of the substrate stage based on a result of the measurement.

According to the fourth aspect of the present invention, by measuring position information of the substrate held on the substrate stage while moving the substrate stage in a state that the optical path space for the exposure light beam is filled with the liquid under the predetermined condition, it is possible to evaluate the influence, brought about by the liquid, on the movement control accuracy of the substrate stage under the predetermined condition.

According to a fifth aspect of the present invention, there is provided an evaluation method for evaluating control accuracy of an exposure apparatus which has a substrate stage capable of moving a substrate and which exposes the substrate through a liquid while moving the substrate with respect to an exposure light beam, the method comprising:

a test-exposure step for test-exposing, under a predetermined exposure condition, a predetermined pattern onto the substrate through the liquid while moving the substrate stage;

a measurement step for measuring an exposure pattern test-exposed on the substrate; and an evaluation step for evaluating movement control accuracy of the substrate stage from a result of the measurement of the exposure pattern.

According to the fifth aspect of the present invention, by observing or measuring the predetermined pattern exposed by performing liquid immersion (test-exposure) on the substrate under a predetermined exposure condition, it is possible to evaluate the influence brought about by the liquid on the movement control accuracy of the substrate stage under the predetermined exposure condition.

BEST MODE FOR CARRYING OUT THE PRESENT INVENTION

In the following, embodiments of the present invention will be described with reference to the accompanying drawing. However, the present invention is not limited to the embodiments.

First Embodiment

Figure 1:
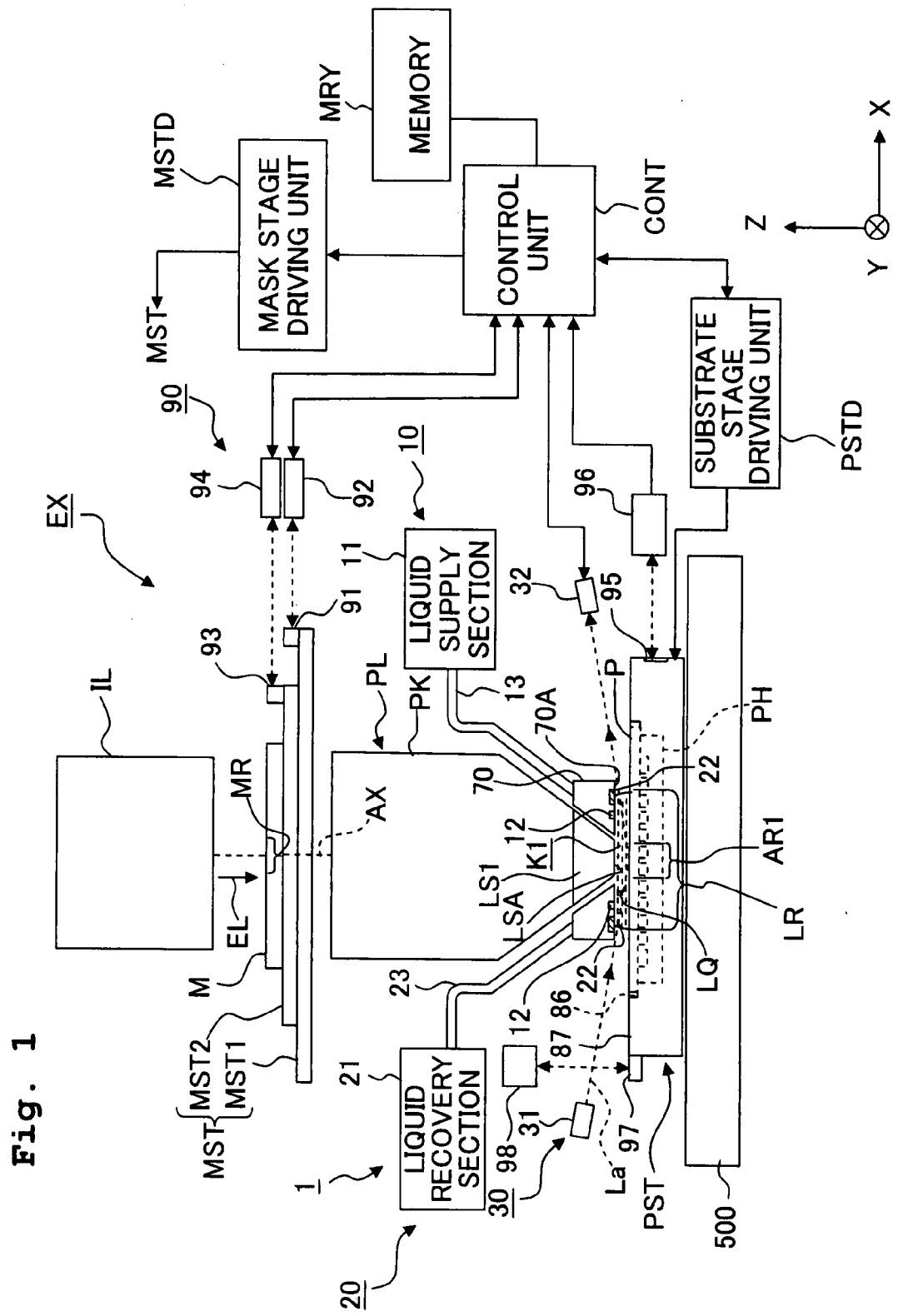
FIG. 1 is a schematic construction diagram showing an embodiment of an exposure apparatus.
Figure 2:
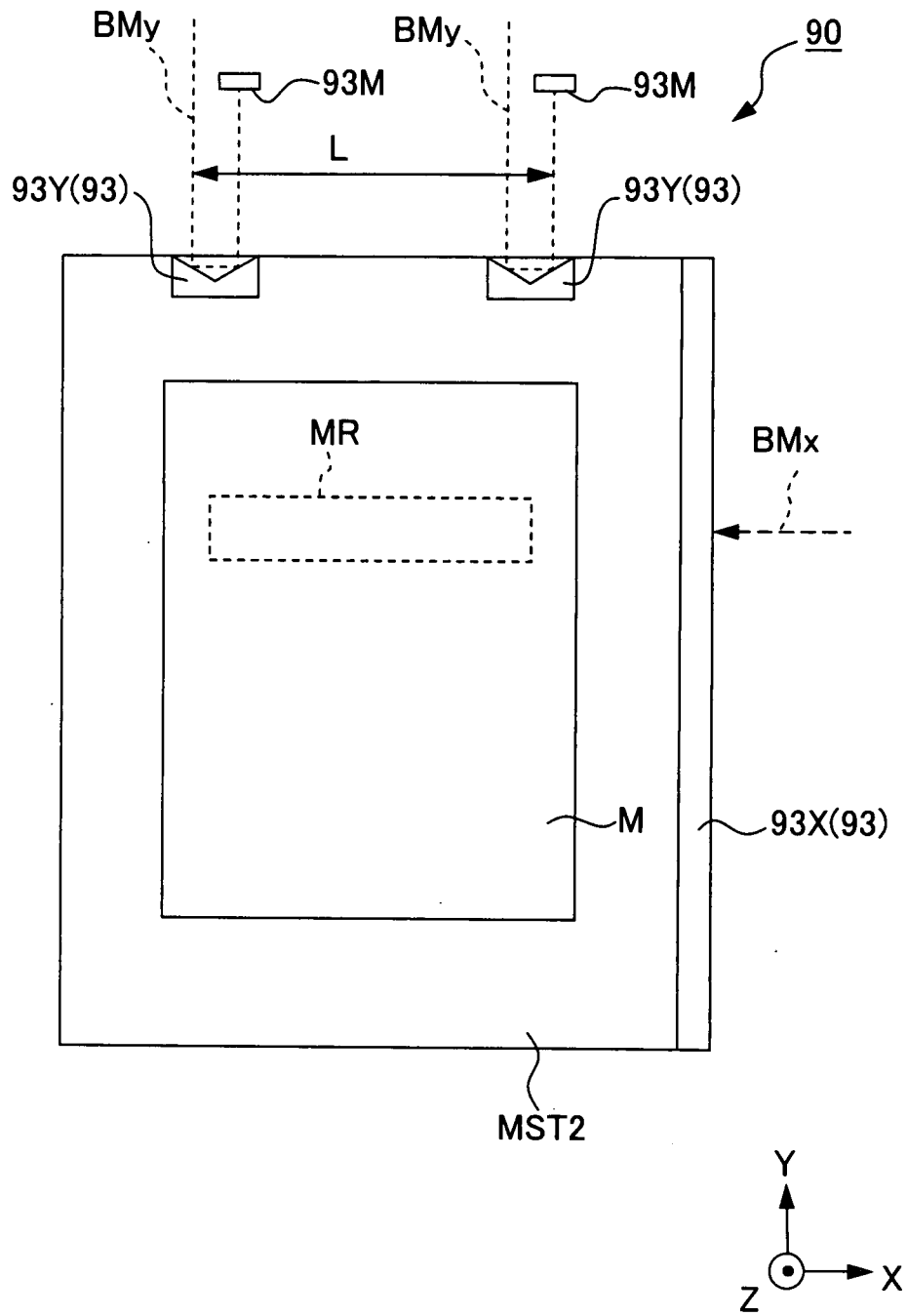
FIG. 2 is a view of a mask stage as seen from a position thereabove.
Figure 3:
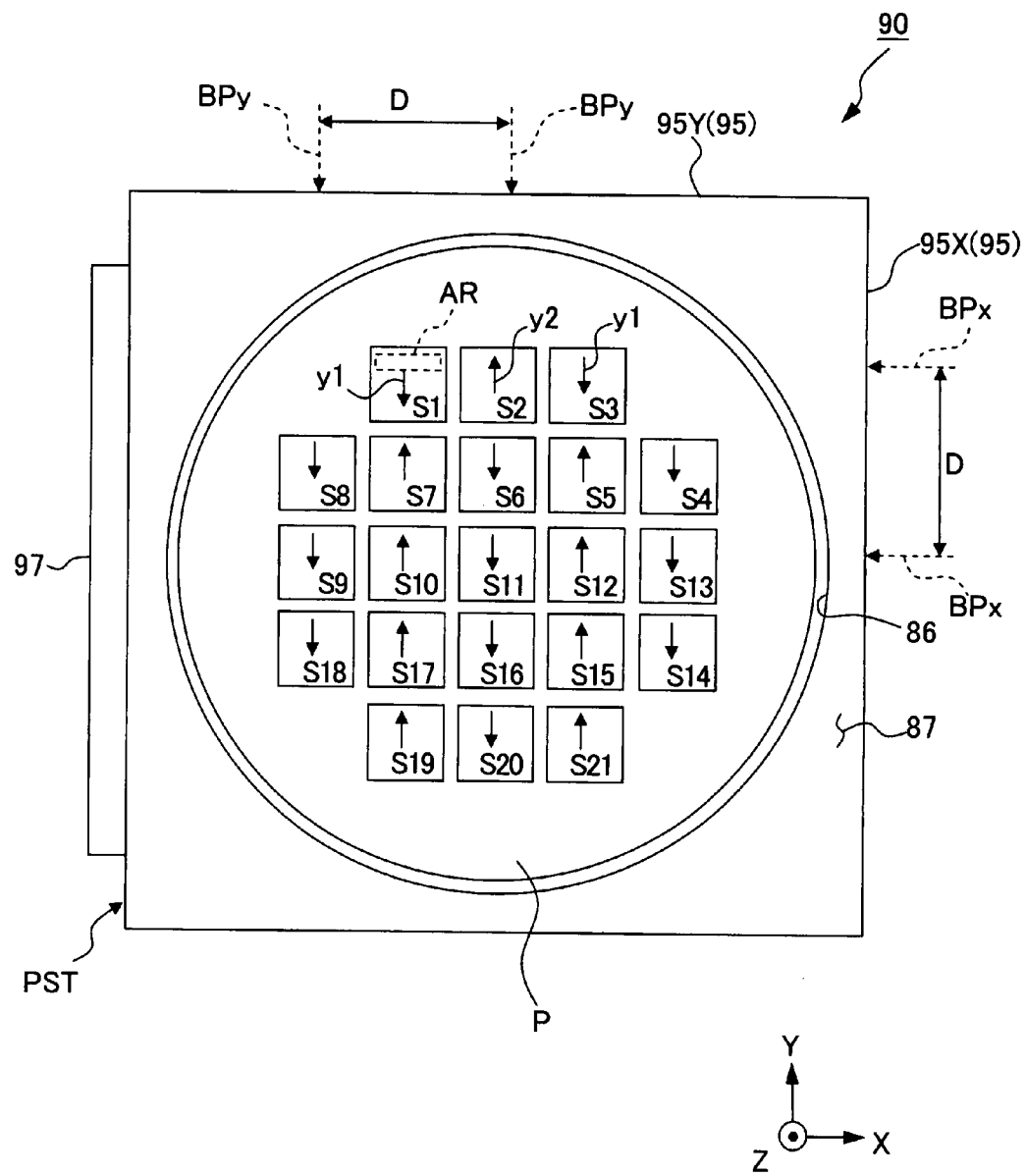
FIG. 3 is a view of a substrate stage as seen from a position therebelow.
Figure 4:
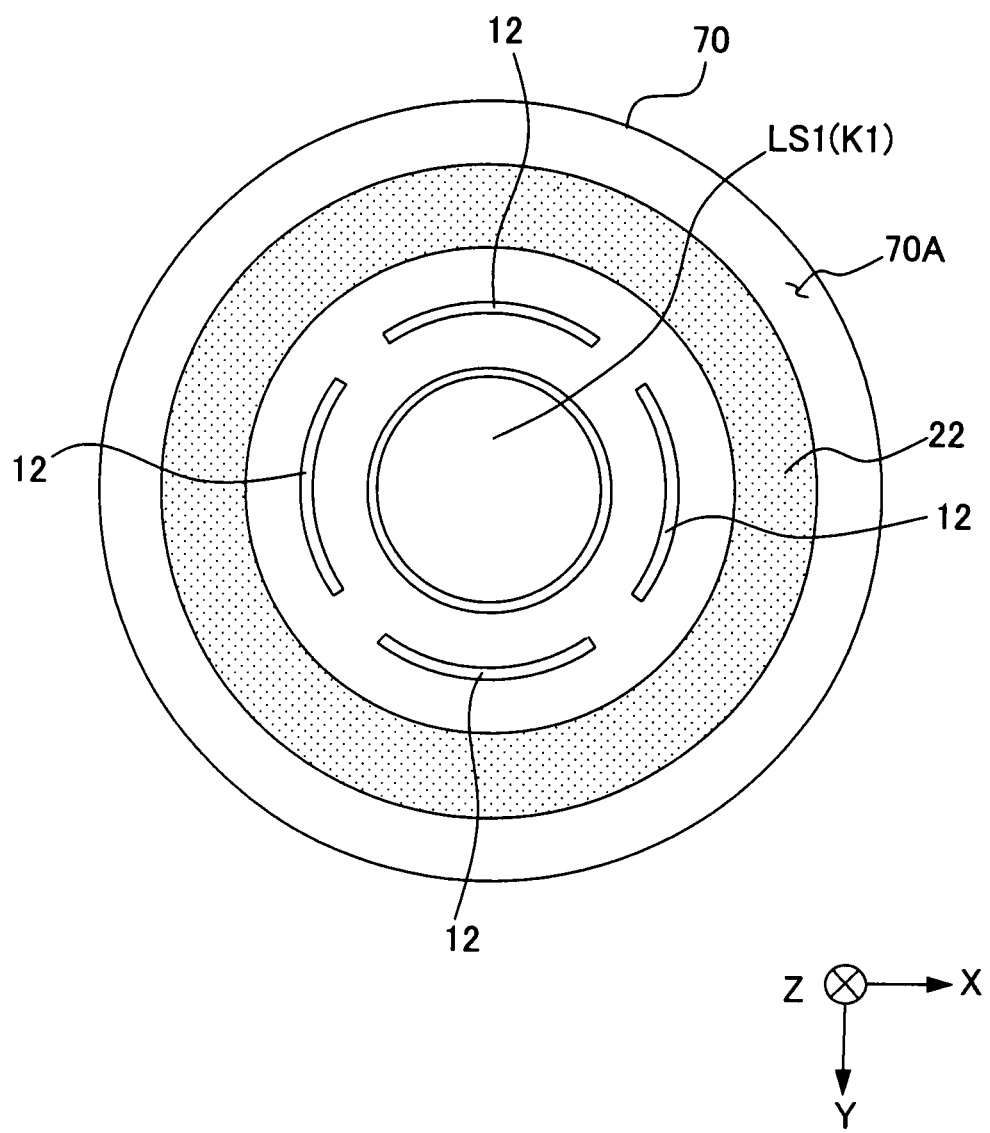
FIG. 4 is a view of a nozzle member as seen from a position therebelow.

An exposure apparatus according to this embodiment will be described with reference to FIGS. 1 to 4. FIG. 1 is a schematic construction diagram showing an exposure apparatus EX, FIG. 2 is a plan view of a mask stage MST, FIG. 3 is a plan view a substrate stage PST, and FIG. 4 is a view of a nozzle member 70 as seen from a position therebelow.

In FIG. 1, the exposure apparatus EX includes a mask stage MST which is movable while holding a mask M having a pattern, a substrate stage PST which has a substrate holder PH for holding a substrate P and which is movable the substrate holder PH holding the substrate P thereon; an interferometer system 90 which measures position informations of the mask stage MST and the substrate stage PST; an illumination optical system IL which illuminates the mask M held on the mask stage MST with an exposure light beam EL; a projection optical system PL which projects an image of the pattern of the mask M, illuminated with the exposure light beam EL, onto the substrate P; a control unit CONT which controls entire operations of the exposure apparatus EX as a whole; and a memory (memory unit) MRY which is connected to the control unit CONT and which stores various informations relating to exposure. The control unit CONT is connected to various measuring units (for example, the interferometer system 90 and a focus/leveling-detecting system 30), driving units (for example, a mask stage-driving unit MSTD and a substrate stage-driving unit PSTD) and the like of the exposure apparatus EX, and the control unit CONT can transmit the measurement result and drive instruction between the control unit CONT and these measuring and driving units.

The exposure apparatus EX of this embodiment is a liquid immersion exposure apparatus to which the liquid immersion method is applied to improve the resolution by substantially shortening the exposure wavelength and to substantially widen the depth of focus. The liquid immersion exposure apparatus has a liquid immersion mechanism 1 for filling, with a liquid LQ, an optical path space K1 for the exposure light beam EL on the side of an image plane of the projection optical system PL. The liquid immersion mechanism 1 includes a nozzle member 70 which is provided in the vicinity on the side of the image plane of the projection optical system PL and which has a supply port 12 for supplying the liquid LQ and a recovery port 22 for recovering the liquid LQ, a liquid supply mechanism 10 supplying the liquid LQ to the side of the image plane of the projection optical system PL through the supply port 12 provided on the nozzle member 70, and a liquid recovery mechanism 20 recovering the liquid LQ on the side of the image plane of the projection optical system PL through the recovery port 22 provided on the nozzle member 70. The nozzle member 70 is formed in an annular shape so as to surround at least a first optical element LS1 closest to the image plane of the projection optical system PL among a plurality of optical elements constructing the projection optical system PL, at a position above the substrate P (substrate stage PST).

The exposure apparatus EX adopts the local liquid immersion method in which, at least during a period of time in which an image of the pattern of the mask M is being projected onto the substrate P, a liquid immersion area LR of the liquid LQ which is larger than the projection area AR and smaller than the substrate P is locally formed, with the liquid LQ supplied from the liquid supply mechanism 10, on the substrate P at a part (portion) thereof, the portion including the projection area AR of the projection optical system PL. Specifically, the exposure apparatus EX fills, with the liquid LQ, an optical path space K1 for the exposure light beam EL between a lower surface LSA of the first optical element LS1 which is closest to the image plane of the projection optical system PL and a surface of the substrate P arranged on the side of the image plane of the projection optical system PL, and the exposure apparatus EX irradiates the substrate P with the exposure light beam EL passing through the mask M, via the projection optical system PL and the liquid LQ filled in the optical path space K1, to thereby projecting the image of the pattern of the mask M onto the substrate P. The control unit CONT locally forms the liquid immersion area LR of the liquid LQ on the substrate P by supplying a predetermined amount of the liquid LQ onto the substrate P by using the liquid supply mechanism 10 and by recovering a predetermined amount of the liquid LQ on the substrate P by using the liquid recovery mechanism 20.

In this embodiment, an explanation will be given about an exemplary case using, as the exposure apparatus EX, a scanning exposure apparatus (so-called scanning stepper) which exposes a pattern formed on the mask M onto the substrate P while synchronously moving the mask M and the substrate P in mutually different directions (mutually opposite directions) in the scanning direction. In the following description, a synchronous moving direction of the mask M and the substrate P in a horizontal plane (scanning direction) is a Y axis direction, a direction orthogonal to the Y axis direction in the horizontal plane is an x axis direction (non-scanning direction), and a direction perpendicular to the Y axis and X axis directions and coincident with an optical axis AX of the projection optical system PL is a Z axis direction. Directions of rotation (inclination) about the X axis, the Y axis, and the Z axis are designated as θX, θY, and θZ directions respectively. The term "substrate" referred herein includes a substrate in which a film such as a photosensitive material (resist), a protective film or the like is coated on a base material of a semiconductor wafer or the like. The term "mask" includes a reticle having a device pattern which is formed thereon and which is to be subjected to a reduction projection onto the substrate.

The illumination optical system IL includes an exposure light source, an optical integrator which uniformizes illuminance of a light flux emitted from the exposure light source, a condenser lens which collects the exposure light beam EL from the optical integrator, a relay lens system, and a field diaphragm which defines an illumination area MR on the mask M to be illuminated by the exposure light beam EL. The predetermined illumination area MR on the mask M is illuminated by the exposure light beam EL with a uniform illuminance distribution by the illumination optical system IL. Lights usable as the exposure light beam EL emitted from the illumination optical system IL include, for example, emission lines (g-ray, h-ray, i-ray) radiated, for example, from a mercury lamp, far ultraviolet light beams (DUV light beams) such as a KrF excimer laser beam (wavelength: 248 nm), and vacuum ultraviolet light beams (VUV light beams) such as an ArF excimer laser beam (wavelength: 193 nm), the $F_2$ laser beam (wavelength: 157 nm), and the like. In this embodiment, the ArF excimer laser beam is used.

In this embodiment, pure or purified water is used as the liquid LQ to be supplied from the liquid supply mechanism 10. Lights transmissive through pure or purified water include the ArF excimer laser beam as well as the emission lines (g-ray, h-ray, i-ray) emitted, for example, from a mercury lamp and the far ultraviolet light beams (DUV light beams) such as the KrF excimer laser beam (wavelength: 248 nm).

The mask stage MST includes a coarse moving stage MST1 which moves on a base member (not shown) along a scanning direction (Y axis direction), and a fine moving stage MST2 which is provided on the coarse moving stage MST1 and is movable while holding the mask M. The fine moving stage MST2 holds the mask M by vacuum attraction (or electrostatic attraction). The mask stage MST including the coarse moving stage MST1 and the fine moving stage MST2 is movable by the driving of the mask stage-driving unit MSTD which includes a linear motor, a voice coil motor or the like and which is controlled by the control unit CONT. By the driving of the mask stage-driving unit MSTD, the coarse moving stage MST1 can be moved in the Y axis direction, and the fine moving stage MST2 is movable in a two-dimensional direction and finely rotatable in the θZ direction within a plane perpendicular to the optical axis AX of the projection optical system PL, that is, within the XY plane, while holding the mask M.

The interferometer system 90 includes a coarse moving stage-interferometer 92 for measuring position information of the coarse moving stage MST1, and a fine moving stage-interferometer 94 for measuring position information of the fine moving stage MST2. The coarse moving stage-interferometer 92 is provided at a position facing (opposite to) a movement mirror 91 provided on the coarse moving stage MST1. The coarse moving stage-interferometer 92 can measure the positions in the Y axis direction and the X axis direction of the coarse moving stage MST1.

The fine moving stage-interferometer 94 is provided at a position facing (opposite to) a movement mirror 93 provided on the fine moving stage MST2. The fine moving stage-interferometer 94 can measure the position in the two-dimensional direction (XY directions) and an angle of rotation in the θZ direction of the fine moving stage MST2. It is also allowable that the rotation angles in the θX and θY directions of the fine moving stage MST2 are measured with the fine moving stage-interferometer 94. It is also allowable that only a part (for example, an optical system) of the coarse moving stage-interferometer 92 and only a part of the fine moving stage-interferometer 94 are arranged so as to face (to be opposite to) the movement mirror 91 and 93, respectively.

In FIG. 2, an X movement mirror 93X extending in the Y axis direction is fixed onto an end in the +X direction of the fine moving stage MST2. Two Y movement mirrors 93Y and 93Y formed of corner cubes (retro reflectors) are fixed onto ends of the +Y direction of the fine moving stage MST2 respectively. The fine moving stage-interferometer 94 irradiates, onto the X movement mirror 93X, a laser beam BMx which is parallel to the X axis, and irradiates, onto the Y movement mirrors 93Y and 93Y respectively, laser beams BMy and BMy which are parallel to the Y axis. The laser beams BMy and BMy reflected by the Y movement mirrors 93Y and 93Y are reflected by reflecting mirrors 93M and 93M and returned to the Y movement mirrors 93Y and 93Y, respectively. That is, the Y axis interferometer which irradiates the laser beams BMy and BMy onto the Y movement mirrors 93Y and 93Y of the fine moving stage interferometer 94 is a so-called double-pass interferometer, and which makes it possible to prevent the positional deviations of laser beams even when the fine moving stage MST2 rotates. Also, as shown in FIG. 2, the illumination area MR, on the mask M, illuminated by the exposure light beam EL is set to have a slit shape (rectangular shape) in which the longitudinal direction is the X axis direction in a field of the projection optical system PL.

Thus, on the fine moving stage MST2, the movement mirror 93X for the X axis and the two movement mirrors 93Y and 93Y for the Y axis are provided, and corresponding to these, the fine moving stage-interferometer 94 also includes a three-axis laser interferometer. However, in FIG. 1, these are shown as the movement mirror 93 and the fine moving stage-interferometer 94 as representatives thereof. Instead of fixing the movement mirrors 91 and 93 onto the coarse moving stage MST1 and the fine moving stage MST2 respectively, it is allowable to use, for example, reflecting surfaces formed by mirror-finishing end surfaces (side surfaces) of the coarse moving stage MST1 and the fine moving stage MST2.

The measurement results of the coarse moving stage-interferometer 92 and the fine moving stage-interferometer 94 are outputted to the control unit CONT. The control unit CONT can obtain, in real-time, the position in the two-dimensional direction (XY direction) and the angle of rotation in the θZ direction of the fine moving stage MST2 (and the mask M, consequently) based on the measurement result of the fine moving stage-interferometer 94. Specifically, the control unit CONT can obtain the position in the X axis direction of the fine moving stage MST2 based on an output of the X axis interferometer in which the laser beam BMx is used as a length measuring axis. Further, the control unit CONT can obtain the position in the Y axis direction of the fine moving stage MST2 based on an average of outputs of two Y axis interferometers in which the laser beams BMy and BMy are used as length measuring axes. Furthermore, the control unit CONT can obtain the angle of rotation in the θZ direction of the fine moving stage MST2 based on a difference between outputs of the two Y axis interferometers and based on a distance L between the laser beams BMy and BMy.

Then, the control unit CONT drives the mask stage-driving unit MSTD based on the measurement results of the coarse moving stage-interferometer 92 and the fine moving stage-interferometer 94, and controls the positions of (performs the position controls for) the coarse moving stage MST1 and the fine moving stage MST2, to thereby control the position of the mask M held on the fine moving stage MST2. The mask stage including the coarse moving stage MST1 and the fine moving stage MST2 is disclosed in, for example, Japanese Patent Application Laid-open No. 8-130179 (corresponding to U.S. Pat. No. 6,721,034).

Referring to FIG. 1 again, the projection optical system PL projects and exposes an image of the pattern of the mask M onto the substrate P at a predetermined projection magnification β, and is constructed of a plurality of optical elements including the first optical element LS1, and these optical elements are held by a barrel PK. In this embodiment, the projection optical system PL is the reduction system having the projection magnification β which is, for example, ¼, ⅕, ⅛ or the like. At the time of exposure, the pattern in the illumination area MR in a pattern forming area of the mask M is reduction-projected on a projection area AR on the substrate P, via the projection optical system PL and the liquid LQ. The projection optical system PL may be any of the reduction system, the ×1 magnification system and the magnifying system. The projection optical system PL may be any one of the dioptric system including no catoptric element, the catoptric system including no dioptric element, and the catadioptric system including dioptric and catoptric elements. The first optical element LS1 closest to the image plane of the projection optical system PL among the plurality of optical elements constructing the projection optical system PL is exposed from the barrel PK.

The substrate stage PST has the substrate holder PH which holds the substrate P, and is movable on a base member 500 on the side of the image plane of the projection optical system PL. The substrate holder PH holds the substrate P by, for example, vacuum attraction or the like. On the substrate stage PST, a recess 86 is provided (formed), and the substrate holder PH for holding the substrate P is arranged in the recess 86. Further, an upper surface 87, which is different from the recess 86, of the substrate stage PST, is formed to be a flat surface (flat portion) having a height approximately same as the height of (flush with) the surface of the substrate P held on the substrate holder PH. It is allowable that a slight difference in height exists between the surface of the substrate P held on the substrate holder PH (substrate stage PST) and the upper surface 87 of the substrate stage PST, provided that the liquid immersion area LR can be satisfactorily maintained or retained. For example, the upper surface 87, of the substrate stage PST, arranged around the substrate P may be slightly lower than the surface of the substrate P held on the substrate holder PH. Alternatively, it is allowable that, a part or portion of the upper surface 87 of the substrate stage PST, for example, only a predetermined area surrounding the substrate P is located at a height almost same as or slightly different from the height of the surface of the substrate P.

The substrate stage PST is movable in the two-dimensional direction (XY direction) and finely rotatable in the θZ direction on the base member 500 within the XY plane in a state that the substrate stage PST holds the substrate P via the substrate holder PH by the driving of the substrate stage-driving unit PSTD which includes a linear motor, a voice coil motor or the like and which is controlled by the control unit CONT. Further, the substrate stage PST is movable also in the Z axis direction perpendicular to the XY directions, in the θX direction, and in the θY direction. Therefore, the surface of the substrate P supported on the substrate stage PST is movable in the six degree of freedom in the X axis, Y axis, Z axis, θX, θY, and θZ directions.

The interferometer system 90 is provided with an XY interferometer 96 and a Z interferometer 98 which measure position information of the substrate stage PST. The XY interferometer 96 is provided at a position facing a movement mirror 95 fixed to a side surface of the substrate stage PST. The XY interferometer 96 is capable of measuring the position in the two-dimensional direction (XY direction) and the angle of rotation in the θZ direction of the substrate stage PST.

In FIG. 3, to a side surface on the +X side of the substrate stage PST, an X movement mirror 95x extending in the Y axis direction is fixed. On a side surface on the +Y side of the substrate stage PST, a Y movement mirror 95Y extending in the X axis direction is provided. The XY interferometer 96 irradiates, onto the X movement mirror 95X, laser beams BPx and BPx parallel to the X axis, and irradiates, onto the Y movement mirror 95Y, laser beams BPy and BPy parallel to the Y axis.

In such a manner, the X axis movement mirror 95X and the Y axis movement mirror 95Y are provided on the substrate stage PST, and corresponding to these, the XY interferometer 96 also includes a four-axis laser interferometer. However, in FIG. 1, the movement mirror 95 and the XY interferometer 96 are shown as representatives of these.

The measurement result of the XY interferometer 96 is outputted to the control unit CONT. The control unit CONT can obtain, in real-time, the position in the two-dimensional direction (XY direction) and the angle of rotation in the θZ direction of the substrate stage PST (and the substrate P, consequently) based on the measurement result of the XY interferometer 96. Specifically, based on an output of the X axis interferometer using the laser beam BPx as a length measuring axis, the control unit CONT can obtain the position in the X axis direction of the substrate stage PST. Further, the control unit CONT can obtain the position in the Y axis direction of the substrate stage PST based on an average of the outputs of two Y axis interferometers in which laser beams BPy and BPy are used as length measuring axes. Furthermore, the control unit CONT can obtain an angle of rotation in the θZ direction of the substrate stage PST based on the difference between the outputs of the two X axis interferometers and based on a distance D between the laser beams BPx and BPx.

Referring to FIG. 1 again, the Z axis interferometer 98 is provided at a position facing a Z movement mirror 97 provided on a side surface of the substrate stage PST. Similar to the XY interferometer 96, the Z interferometer 98 also has a plurality of length measuring axes, and can measure the position in the Z axis direction and the angles of rotation in the θ and θY directions of the substrate stage PST. The measurement result of the Z interferometer 98 is outputted to the control unit CONT. The control unit CONT can obtain in real-time the position in the Z axis direction and the angles of rotation in the θX and θY directions of the substrate stage PST, based on the measurement result of the z interferometer 98. It should be noted that the details of the exposure apparatus including the Z interferometer 98 are disclosed in, for example, Published Japanese Translation of PCT International Publication for Patent Application No. 2001-510577 (corresponding to Pamphlet of International Publication No. 1999/28790). It is also allowable that only a part (for example, the optical system) of the XY interferometer 96 and a part of the Z interferometer 98 is provided so as to be opposite to the movement mirrors 95 and 97, respectively. Alternatively, instead of fixing the movement mirrors 95 and 97 to the substrate stage PST, it is allowable to use, for example, reflecting surface(s) which is formed by mirror-finishing a part (a side surface or the like) of the substrate stage PST. Further, the XY interferometer 96 may be a three-axis laser interferometer, or the XY interferometer 96 may be formed as a five-axis laser interferometer so that the XY interferometer is capable of measuring angles of rotation in the θX and θY directions, in place of the Z interferometer 98.

The exposure apparatus EX is provided with focus/leveling-detecting system 30 of an oblique incidence type which detects position information of the surface of the substrate P supported on the substrate stage PST, as disclosed in, for example, Japanese Patent Application Laid-open No. 8-37149 (corresponding to U.S. Pat. No. 6,327,025). The focus/leveling-detecting system 30 has a projector 31 which irradiates, onto the surface of the substrate P, a detection light beam La in an oblique direction with respect to the surface of the substrate P, and a light-receiver 32 which is provided in a predetermined positional relationship with the detection light beam La, and which receives a reflected light of the detection light beam La irradiated onto the surface of the substrate P, and the focus/leveling-detecting system 30 detects position information (position information in the Z axis direction and inclination information in the θX and θY directions) of the surface of the substrate P, based on the light-reception result of the light-receiver 32. In this embodiment, the projector 31 of the focus/leveling-detecting system 30 irradiates detection light beam La onto each of a plurality of positions located in the liquid immersion area LR on the surface of the substrate P. That is, the focus/leveling-detecting system 30 detects the position information of the surface of the substrate P through the liquid LQ. The focus/leveling-detecting system 30 may be constructed to detect the position information of the surface of the substrate P not through the liquid LQ, but by irradiating detection light beam La onto an area outside (onto the outer side of) the liquid immersion area LR. The result of detection of the focus/leveling-detecting system 30 is outputted to the control unit CONT. The control unit CONT can obtain in-real-time the position information of the surface of the substrate P in a state that the liquid LQ is filled between the projection optical system PL and the substrate P, based on the measurement result of the focus/leveling-detecting system 30.

Then, the control unit CONT drives the substrate stage-driving unit PSTD based on the measurement result of the XY interferometer 96 and performs position control in the x axis direction, Y axis direction, and θZ direction of the substrate stage PST, to thereby control the positions in the x axis direction, Y axis direction, and θZ direction of the substrate P held on the substrate stage PST. The control unit CONT drives the substrate stage-driving unit PSTD based on the result of detection of the focus/leveling-detecting system 30 etc., to perform position control in the Z axis direction, θX direction, and θY direction of the surface of the substrate P.

Next, the liquid supply mechanism 10 and the liquid recovery mechanism 20 of the liquid immersion mechanism 1 will be described. The liquid supply mechanism 10 supplies the liquid LQ to the side of the image plane of the projection optical system PL. The liquid supply mechanism 10 includes a liquid supply section 11 which can feed the liquid LQ and a supply tube 13 having an end connected to the liquid supply section 11. The other end of the supply tube 13 is connected to the nozzle member 70. In the inside of the nozzle member 70, an internal flow channel (supply channel) which connects the other end of the supply tube 13 and the supply ports 12 is formed. The liquid supply section 11 includes a tank which stores the liquid LQ, a pressurizing pump, a temperature-adjusting unit which adjusts the temperature of the liquid LQ to be supplied, and a filter unit which removes foreign matter in the liquid LQ, and the like. The liquid supply operation of the liquid supply section 11 is controlled by the control unit CONT. It is not necessarily indispensable that the tank, pressurizing pump, temperature-adjusting unit, filter unit and the like, of the liquid supply mechanism 10, are all included in the exposure apparatus EX, and it is allowable that facilities of the factory in which the exposure apparatus EX is installed are used instead.

The liquid recovery mechanism 20 recovers the liquid LQ on the side of the image plane of the projection optical system PL. The liquid recovery mechanism 20 includes a liquid recovery section 21 capable of recovering the liquid LQ, and a recovery tube 23 having an one connected to the liquid recovery section 21. The other end of the recovery tube 23 is connected to the nozzle member 70. In the inside of the nozzle member 70, an internal flow channel (recovery channel) which connects the other end of the recovery tube 23 and the recovery port 22 is formed. The liquid recovery section 21 includes a vacuum system (sucking unit) such as a vacuum pump, a gas-liquid separator which separates the recovered liquid LQ and gas(es), a tank which stores the recovered liquid LQ, and the like. It is not necessarily indispensable that the vacuum system, gas-liquid separator, tank and the like of the liquid recovery mechanism 20 are all included in the exposure apparatus EX, and it is allowable that facilities of the factory in which the exposure apparatus EX is installed are used instead.

The supply port 12 for supplying the liquid LQ and the recovery port 22 for recovering the liquid LQ are formed in the lower surface 70A of the nozzle member 70. The lower surface 70A of the nozzle member 70 is arranged at a position opposite to (facing) the surface of the substrate P and the upper surface 87 of the substrate stage PST. The nozzle member 70 is an annular member provided so as to surround the side surface of at least one optical element (the first optical element LS1 in this embodiment) disposed on the side of the image plane of the projection optical system PL, and the supply port 12 is provided as a plurality of supply ports 12 arranged on the lower surface 70A of the nozzle member 70 at a plurality of positions respectively to surround the optical path space K1 (first optical element LS1) for the exposure light beam EL.

As shown in FIG. 4, in this embodiment, four pieces of the supply ports 12 are provided so as to surround the optical path space K1 for the exposure light beam EL, and each of the supply ports 12 is formed in a slit shape which is in an arc shape in a plan view and has a predetermined length and a predetermined width. The recovery port 22 is provided further outside, than the supply ports 12, with respect to the optical path space K1 on the lower surface 70A of the nozzle member 70, and is provided in an annular shape so as to surround the optical path space K1 (first optical element LS1) and the supply ports 12. At the recovery port 22 of this embodiment, a porous member is provided. The porous member is formed of, for example, a ceramics-made porous material, a titanium-made plate-shaped mesh or the like.

The control unit CONT supplies a predetermined amount of the liquid LQ onto the substrate P by using the liquid supply mechanism 10, and recovers a predetermined amount of the liquid LQ on the substrate P by using the liquid recovery mechanism 20, to thereby fill, with the liquid LQ, the optical path space K1 for the exposure light beam EL between the projection optical system PL and the substrate P and to locally form a liquid immersion area LR of the liquid LQ on the substrate P. When forming the liquid immersion area LR of the liquid LQ, the control unit CONT drives each of the liquid supply section 11 and the liquid recovery section 21. When the liquid LQ is fed out from the liquid supply section 11 under control of the control unit CONT, the liquid LQ fed out from the liquid supply section 11 flows through the supply tube 13, and then is supplied, after flowing through the supply flow channel in the nozzle member 70, to the side of the image plane of the projection optical system PL from the supply ports 12. When the liquid recovery section 21 is driven under the control of the control unit CONT, the liquid LQ on the side of the image plane of the projection optical system PL flows into the recovery flow channel of the nozzle member 70 through the recovery port 22, and flows through the recovery tube 23, and is then recovered by the liquid recovery section 21.

Next, an explanation will be given about an example of the control method for exposing the substrate P while synchronously moving the mask stage MST holding the mask M and the substrate stage PST holding the substrate P with respect to the Y axis direction.

As shown in FIG. 3, on the substrate P, a plurality of shot areas S1 to S21 are defined in a matrix form, and the shot areas S1 to S21 defined on the substrate P are successively exposed. When each of the shot areas S1 to S21 on the substrate P is exposed by means of the liquid immersion, the control unit CONT performs the scanning exposure for each of the shot areas S1 to S21 on the substrate P while moving the substrate P held on the substrate stage PST in the Y axis direction with respect to the exposure light beam EL (projection optical system PL) in a state that the optical path space K1 for the exposure light beam EL between the projection optical system PL and the substrate P is filled with the liquid LQ by using the liquid immersion mechanism 1. As shown in FIG. 3, the projection area AR of the projection optical system PL in this embodiment is set to be a slit shape (rectangular shape) in which the X axis direction is the longitudinal direction. The control unit CONT performs the scanning exposure for each of the shot areas S1 to S21 while relatively moving the projection area AR irradiated with the exposure light beam EL and each of the shot areas S1 to S21 on the substrate P in the directions indicated by arrows y1 and y2.

In this embodiment, the control unit CONT performs the scanning exposure for the first shot area S1 firstly among the shot areas S1 to S21 defined on the substrate P. When performing the scanning exposure for the first shot area S1, the control unit CONT moves the first shot area S1 to a scanning start position and moves the substrate P (substrate stage PST) so as to relatively move the projection area AR and the first shot area S1 in the arrow y1 direction, and performs the scanning exposure for the first shot area S1. After performing the scanning exposure for the first shot area S1, the control unit CONT relatively step-moves the projection optical system PL and the substrate P (substrate stage PST) in the X axis direction so as to perform the scanning exposure for the next second shot area S2. The control unit CONT step-moves the substrate P to move the second shot area S2 to the scanning start position, and moves the substrate P (substrate stage PST) so that the projection area AR and the second shot area S2 relatively move in the direction of the arrow y2, and then performs the scanning exposure for the second shot area S2. After the completion of the scanning exposure for the second shot area S2, the control unit CONT relatively step-moves the projection optical system PL and the substrate P (substrate stage PST) in the X axis direction so as to perform the scanning exposure for the next third shot area S3. Similarly, after performing the scanning exposure for one shot area, the control unit CONT moves the next shot area to the scanning start position by step-moving the substrate P. Afterwards, the control unit CONT successively performs the exposure for each of the first to twenty-first shot areas S1 to S21 while moving the substrate P in the step-and-scan manner.

Upon performing the scanning exposure for one shot area, the control unit CONT moves this shot area to the scanning start position, and then drives the substrate P (substrate stage PST) so that the substrate is, with respect to the Y axis direction, first in an accelerating state in which the substrate is moving while accelerating, then in a constant-speed state in which the substrate is moving at a constant speed, and then in a decelerating state in which the substrate is moving while decelerating, in this order. At the time of scanning exposure, an image of a part of the pattern of the mask M corresponding to the illumination area MR of the exposure light beam EL on the mask M is projected onto the slit-shaped (rectangular-shaped) projection area AR of the projection optical system PL.

In the above-described constant-speed state, the control unit CONT performs the scanning for the substrate stage PST in the −Y direction (or +Y direction) at a scanning speed $V_p$ (=$\beta \cdot V_m$) via the substrate stage-driving unit PSTD in synch with performing the scanning for the coarse moving stage MST1 via the mask stage-driving unit MSTD in the +Y direction (or −Y direction) at a predetermined scanning speed Vm, and the control unit CONT controls the operation of the fine moving stage MST2 via the mask stage-driving unit MSTD so as to make the relative position error to be small between the fine moving stage MST2 and the substrate stage PST (between the pattern of the mask M and the shot area on the substrate P) generated at this time.

The control unit CONT synchronously moves the mask stage MST (fine moving stage MST2) and the substrate stage PST with respect to the Y axis direction while monitoring the measurement results of the interferometers 92 and 24 which measure the position information of the mask stage MST and the XY interferometer 96 which measures the position information of the substrate stage PST.

The control unit CONT controls the substrate stage-driving unit PSTD, based on the position information and speed information of the substrate stage PST obtained from the measurement result of the XY interferometer 96, so that the substrate stage PST is positioned at a target position in a coordinate system defined by the interferometer system 90 (XY interferometer 96) and that the substrate P is moved at a target speed Vp. The control unit CONT can obtain speed information of the substrate stage PST by, for example, differentiating the measurement result of the XY interferometer 96. The control unit CONT performs so-called feed-back control in which the control unit CONT calculates a control amount for making the difference to be small between the position of the substrate stage PST and the target position and for making the difference to be small between the speed of the substrate stage PST and the target speed Vp (control amount for moving the substrate stage PST at the target speed Vp), based on the measurement result of the XY interferometer 96, and the control unit CONT drives the substrate stage PST based on the control amount.

The control unit CONT controls the mask stage-driving unit MSTD based on the position information and speed information of the coarse moving stage MST1 obtained from the measurement result of the coarse moving stage-interferometer 92 so that the coarse moving stage MST1 is arranged at a target position in a coordinate system defined by the interferometer system 90 (coarse moving stage interferometer 92) and that the coarse moving stage MST1 is moved at a target speed Vm. The control unit CONT can obtain speed information of the coarse moving stage MST1 by, for example, differentiating the measurement result of the coarse moving stage-interferometer 92. The control unit CONT performs so-called feed-back control in which the control unit CONT calculates a control amount for making the difference to be small between the position of the coarse moving stage MST1 and the target position and for making the difference to be small between the speed of the coarse moving stage MST1 and the target speed Vm (control amount for moving the coarse moving stage MST1 at the target speed Vm), based on the measurement result of the coarse moving stage-interferometer 92, and the control unit CONT drives the coarse moving stage MST1 based on the control amount.

The control unit CONT controls the mask stage MSTD (fine moving stage MST2) based on the position information and/or speed information of the fine moving stage MST2 obtained from the measurement result of fine moving stage-interferometer 94 and the position information and/or speed information of the substrate stage PST obtained from the measurement result of the XY interferometer 96 so that the fine moving stage MST2 and the substrate stage PST have a desired positional relationship with each other in the coordinate system defined by the interferometer system 90. The control unit CONT performs so-called feed-back control in which the control unit OCNT drives the fine moving stage MST2 based on the measurement results of the XY interferometer 96 and the fine moving stage-interferometer 94 so that the relative position error between the fine moving stage MST2 and the substrate stage PST is made to be small.

In such a manner, the control unit CONT obtains movement information (including at least one of position information, speed information, and acceleration information) of each of the mask stage MST and the substrate stage PST by using the interferometer system 90 including the interferometers 92, 94, and 96, and the control unit CONT controls movements of the mask stage MST and the substrate stage PST via the mask stage-driving unit MSTD and the substrate stage-driving unit PSTD respectively so that each of the mask stage MST and the substrate stage PST is in a desired state (in a desired position, a desired speed, and in a desired acceleration) and that the mask M and the substrate P (the fine moving stage MST2 and the substrate stage PST) are in a desired positional relationship in the coordinate system defined by the interferometer system 90.

Also in a case in which the control unit CONT performs the feedback-control for the movement of the fine moving stage MST2 based on the measurement result of the XY interferometer 96 and the measurement result of the fine moving stage-interferometer 94, there is a possibility that a slight synchronization control error remains between the fine moving stage MST2 and the substrate stage PST. Therefore, the control unit CONT can monitor the measurement result of the XY interferometer 96 and the measurement result of the fine moving stage-interferometer 94 and can store these results in the memory MRY, as will be described later on.

Figure 5:
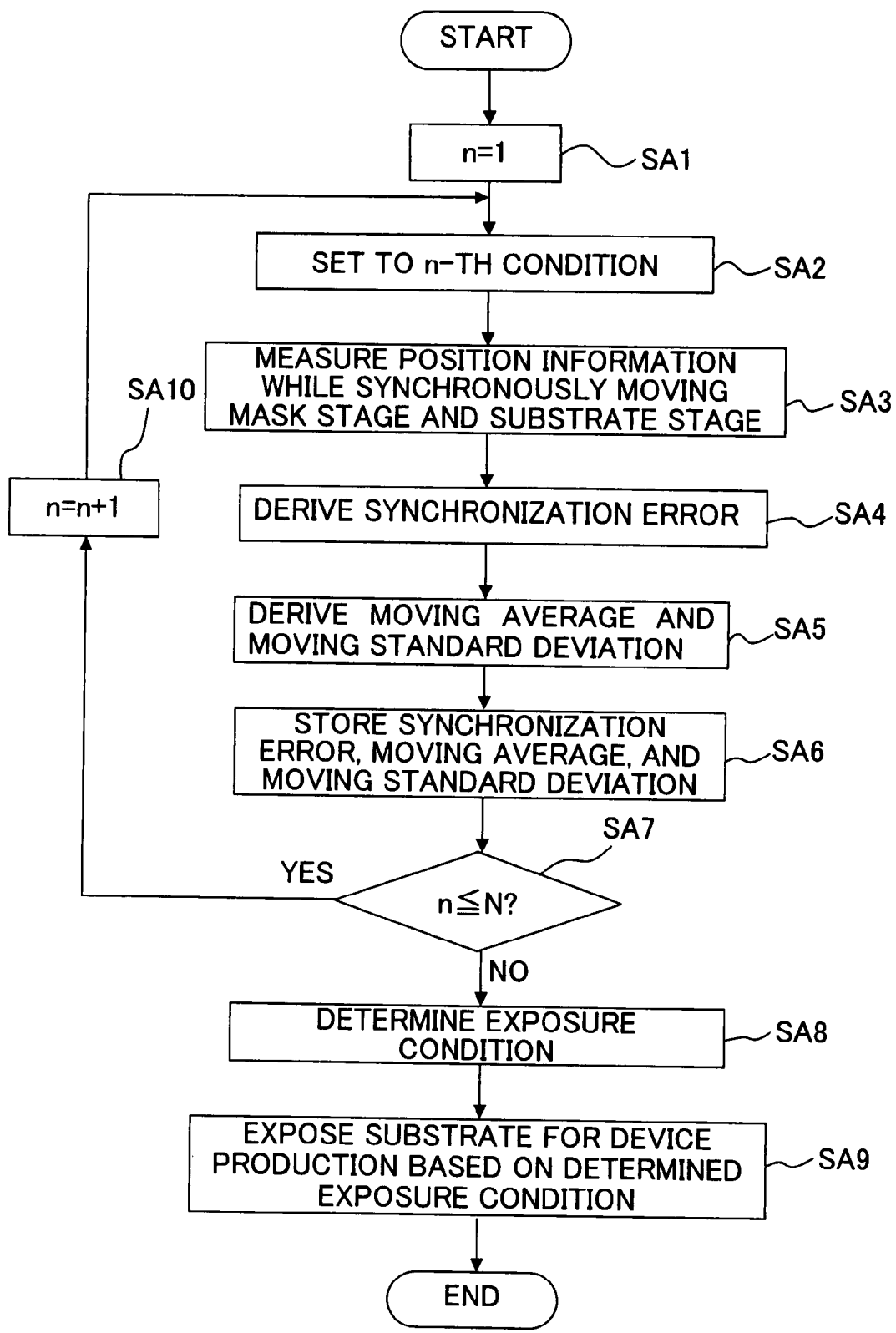
FIG. 5 is a flowchart for explaining an embodiment of an exposure method.

Next, a method for exposing an image of the pattern of the mask M onto the substrate P by using the exposure apparatus EX constructed as described above will be described with reference to the flowchart of FIG. 5.

In this embodiment, before actually performing the exposure for the substrate P for device production, movement control accuracy of the substrate stage PST is obtained and an exposure condition of the substrate P is determined. In the liquid immersion exposure apparatus EX, when the apparatus controls the substrate stage PST and exposes the substrate P while moving the substrate stage PST (substrate P) with respect to the optical path space K1 (exposure light beam EL) in a state that the optical path space K1 is filled with the liquid LQ, there is a possibility that the movement control accuracy of the substrate stage PST fluctuates (deteriorates) due to viscous resistance of the liquid LQ, vibration caused by the liquid LQ, etc. The movement control accuracy of the substrate stage PST includes movement control accuracy in the XY directions and movement control accuracy in the Z axis direction.

The movement control accuracy in the XY directions of the substrate stage PST includes the synchronization error between the mask stage MST (fine moving stage MST2) and the substrate stage PST. The synchronization error includes an amount of relative position deviation (position error) between the mask stage MST (fine moving stage MST2) and the substrate stage PST in the coordinate system defined by the interferometer system 90 when the mask stage MST and the substrate stage PST are synchronously moved with respect to the predetermined scanning direction.

There is a possibility that the synchronization error fluctuates depending on a condition for moving the substrate stage PST in a state that the optical path space K1 is filled with the liquid LQ. The condition includes a liquid immersion condition upon filling the optical path space K1 for the exposure light beam EL with the liquid LQ, and there is a possibility that the synchronization error fluctuates depending on the liquid immersion condition. Here, the term "liquid immersion condition" includes at least one of a supply condition for supplying the liquid LQ into the optical path space K1 by the liquid immersion mechanism 1, and a recovery condition for recovering the liquid LQ. More specifically, the liquid immersion condition includes a liquid supply amount per unit time into the optical path space K1 or a liquid recovery amount per unit time.

Therefore, in this embodiment, before performing the exposure for the substrate P, the movement control accuracy of the substrate stage PST is obtained under each of a plurality of conditions, and the movement control accuracy under each of the conditions is evaluated, and perform a process for determining an optimal exposure condition in which the movement control accuracy (error) becomes small.

For simplicity, in the following description, by way of example, a case is explained in which an evaluation is made for the movement control accuracy in the XY directions of the substrate stage PST, specifically for a synchronization error when the mask stage MST and the substrate stage PST are synchronously moved with respect to the Y axis direction, and an exposure condition is determined in which the synchronization error is the smallest. Also, an explanation will be given about a case in which a liquid supply amount per unit time into the optical path space K1, with which the synchronization error becomes small, is determined as the exposure condition (liquid immersion condition).

First, the control unit CONT makes a preparation for obtaining the synchronization error under a first condition (Step SA1). The control unit CONT loads the mask M onto the mask stage MST and loads the substrate P onto the substrate stage PST.

Then, the control unit CONT fills the optical path space K1 with the liquid LQ under the first condition by using the liquid immersion mechanism 1, and sets the exposure apparatus EX to the first condition (Step SA2). Here, it is assumed that the control unit CONT supplies $B_1$ (liter) of the liquid LQ per unit time to the optical path space K1 by using the liquid immersion mechanism 1.

Then, in the state that the optical path space K1 is filled with the liquid LQ under the first condition, the control unit CONT outputs target information (target position and/or target speed), and controls the mask stage MST and the substrate stage PST to synchronously move the mask stage MST holding the mask M and the substrate stage PST holding the substrate P with respect to the Y axis direction. In this embodiment, the synchronized movement for obtaining the synchronization error is performed so as to expose each of the shot areas S1 to S21 in the step-and-scan manner as described with reference to FIG. 3, similar to the actual exposure for device production.

The following description is given as if the measurement of position information of each of the fine moving stage MST2 (mask M) of the mask stage MST and the substrate stage PST (substrate P) by using the interferometer system 90 is performed parallel to the exposure of each of the shot areas. Actually, however, the exposure light beam EL is not radiated onto the substrate p.

First, the control unit CONT measures the position information of each of the fine moving stage MST2 (mask M) of the mask stage MST and the substrate stage PST (substrate P) by using the interferometer system 90 while synchronously moving the mask stage MST and the substrate stage PST with respect to the Y axis direction (Step SA3) so as to perform the scanning exposure for the shot area S1.

The control unit CONT obtains a measured value by the interferometer system 90, specifically, simultaneously obtains measured values of the fine moving stage-interferometer 94 and the XY interferometer 96 at predetermined sampling interval. That is, the control unit CONT simultaneously acquires the position informations of the mask stage MST and the substrate stage PST at the predetermined sampling interval. The control unit CONT stores the obtained measured values (position informations of the fine moving stage MST2 and the substrate stage PST) in the memory MRY by associating the values (informations) with a time (timing) elapsed from the exposure start time point, as the reference time point, at which the exposure for the shot area S1 was started.

Figure 6:
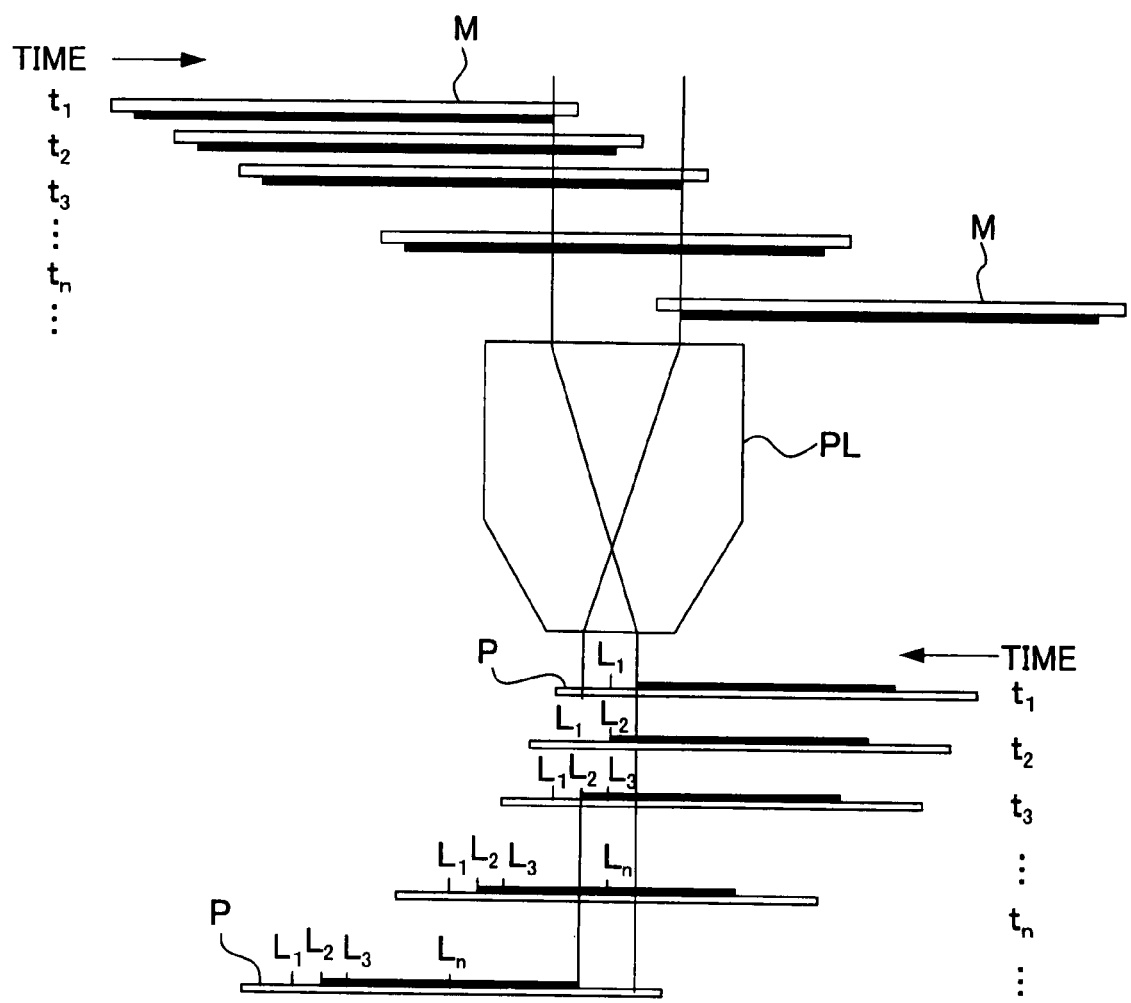
FIG. 6 is a schematic view for explaining operations of a mask and a substrate.

This will be described with reference to the schematic view of FIG. 6. Upon performing exposure for a certain shot area (for example, the shot area S1) on the substrate P, the positions of the mask M and the substrate P with respect to the projection optical system PL change with time. That is, as shown in FIG. 6, at a timing $t_1$ as the exposure start time point, a point $L_1$ on the substrate P is at the center of the projection area AR, and thereafter, as the time elapses to timings $t_2, t_3 \ldots t_n \ldots$, points $L_2, L_3 \ldots L_n \ldots$ on the substrate P successively move to the center of the projection area AR. The control unit CONT stores measured values of the interferometer system 90 (measured values of the fine moving stage-interferometer 94 and the XY interferometer 96) in the memory MRY by associating these measured values with the timing $t_2, t_3 \ldots t_n$ respectively, regarding the timing $t_1$ as the reference.

Then, the control unit CONT moves the mask stage MST and the substrate stage PST so as to successively perform the scanning exposure for the plurality of shot areas S2 to S21, and successively stores the measured values of the interferometer system 90 in the memory MRY.

Next, the control unit CONT derives a synchronization error between the mask stage MST (fine moving stage MST2) and the substrate stage PST, based on the measurement results on position informations of the mask M and the substrate P measured by using the interferometer system 90 while synchronously moving the mask stage MST (fine moving stage MST2) and the substrate stage PST (Step SA4). Specifically, the control unit CONT obtains synchronization errors ErrX, ErrY, and Errθ between the fine moving stage MST2 (mask M) and the substrate stage PST (substrate P) in the X axis direction, the Y axis direction, and the θZ direction respectively based on the measurement results of the interferometers 94 and 96 stored at the same timing in the memory MRY. As described above, the synchronization error is an amount of deviation (relative position error) from a desired relative positional relationship between the mask stage MST (fine moving stage MST2) and the substrate stage PST in the coordinate system defined by the interferometer system 90 when the mask stage MST (fine moving stage MST2) and the substrate stage PST are synchronously moved. Therefore, the control unit CONT can obtain synchronization errors in the X axis direction, the Y axis direction, and the θZ direction based on the measurement results of the interferometers 94 and 96 which are capable of measuring position information and rotation information in the two-dimensional direction (XY direction) of each of the mask stage MST (fine moving stage MST2) and the substrate stage PST.

Figure 7:
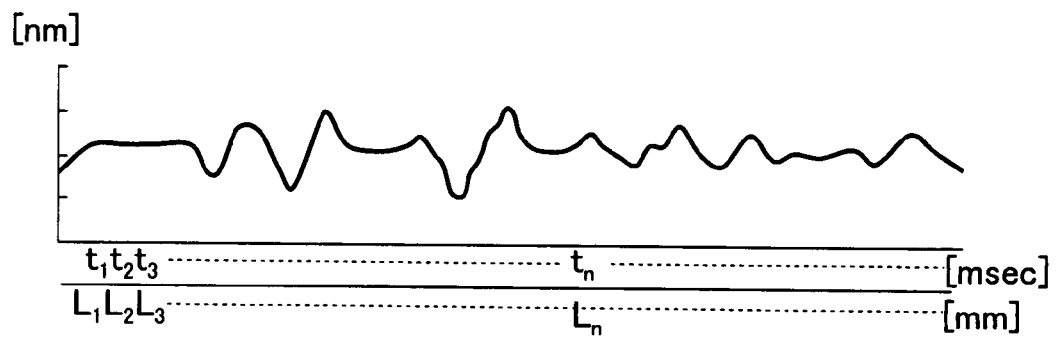
FIG. 7 is a diagram for explaining a synchronization error.

As a result, regarding a one shot area, a graph for example, as shown in FIG. 7 is obtained showing a change in the synchronous error in each of the X axis direction, Y axis direction, and θZ direction. The vertical axis of the graph of FIG. 7 indicates a synchronization error, and the horizontal axis of the graph indicates time. In the graph of FIG. 7, although the horizontal axis is a time axis, the horizontal axis may be a coordinate axis (for example, Y axis) on the substrate P defined by the interferometer system 90.

Then, the control unit CONT obtains the synchronization error for all of the plurality of shot areas S1 to S21.

Next, based on the obtained synchronization error, the control unit CONT obtains an average (hereinafter referred to as "moving average" as appropriate) of the synchronization error in a period of time from the entrance of an arbitrary point $L_n$, in the shot area on the substrate P, into the illumination area MR as the slit area, namely the projection area AR conjugate to the illumination area MR, to the exit of the arbitrary point $L_n$ from the illumination area MR, and the control unit CONT obtains a standard deviation (hereinafter referred to as "moving standard deviation" as appropriate) as a degree of dispersion (spreading) around the synchronization error average (Step SA5).

The moving average (MA) and the moving standard deviation (MSD) can be calculated by using the following formulas (1) and (2). Here, the number of data fetch (obtaining) in the period of time from the entrance of the point $L_n$ into the projection area AR to the exit of the entrance of the point $L_n$ from the projection area AR, namely the number of data obtained at a slit width (width in the scanning direction of the projection area AR: for example, 8 mm), with the n-th data as the center, is defined as m (m times).

[Formula 1]

$$Av(ErrX)_n = \frac{\sum_{i=n-(m-1)/2}^{n+(m-1)/2}(ErrX_i)}{m}$$

$$Av(ErrY)_n = \frac{\sum_{i=n-(m-1)/2}^{n+(m-1)/2}(ErrY_i)}{m} \quad (1)$$

$$Av(Err\theta)_n = \frac{\sum_{i=n-(m-1)/2}^{n+(m-1)/2}(Err\theta_i)}{m}$$

In the formula (1), $Av(ErrX)_n$, $Av(ErrY)_n$, and $Av(Err\theta)_n$ indicate moving averages in the X axis direction, the Y axis direction, and the $\theta Z$ direction, respectively.

[Formula 2]

$$\sigma(ErrX)_n = \sqrt{\frac{\sum_{i=n-(m-1)/2}^{n+(m-1)/2}\{ErrX_i - Av(ErrX)_n\}^2}{m-1}}$$

$$\sigma(ErrY)_n = \sqrt{\frac{\sum_{i=n-(m-1)/2}^{n+(m-1)/2}\{ErrY_i - Av(ErrY)_n\}^2}{m-1}} \quad (2)$$

$$\sigma(Err\theta)_n = \sqrt{\frac{\sum_{i=n-(m-1)/2}^{n+(m-1)/2}\{Err\theta_i - Av(Err\theta)_n\}^2}{m-1}}$$

In the formula (2), $\sigma(ErrX)_n$, $\sigma(ErrY)_n$, and $\sigma(Err\theta)_n$ indicate moving standard deviations in the X axis direction, the Y axis direction, and the $\theta Z$ direction, respectively.

Figure 8:
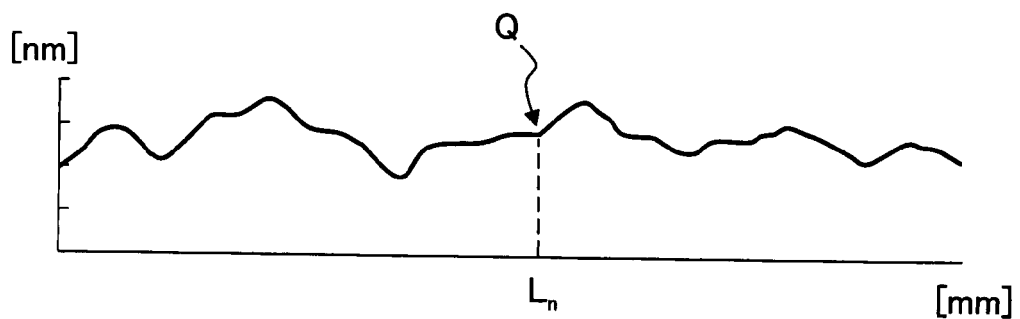
FIGS. 8(A) and 8(B) are diagrams for explaining a moving average and a moving standard deviation, respectively.
Figure 8:

As a result, regarding one shot area, a graph showing a change in the moving average as shown in FIG. 8(A), and a graph showing a change in the moving standard deviation as shown in FIG. 8(B) are obtained for each of the X axis direction, the Y axis direction, and the $\theta Z$ direction. Here, the vertical axis of the graph of FIG. 8 indicates the synchronization error, and the horizontal axis of the graph is the Y axis of the shot coordinate system. A point Q corresponding to a point on the horizontal axis $L_n$ of FIG. 8(A) corresponds to an average of the section from a point $L_{n-(m-1)/2}$ to a point $L_{n+(m-1)/2}$ in the graph of FIG. 7 showing the synchronization error.

The control unit CONT calculates the moving average and the moving standard deviation for each of the all shot areas S1 to S21.

The control unit CONT stores the synchronization error and the information about the moving average and moving standard deviation derived from the synchronization error in the memory MRY (Step SA6).

With the above-described processes, the synchronization error, the moving average, and the moving standard deviation in the first condition are obtained. After obtaining the synchronization error, moving average, and moving standard deviation in the first condition, the control unit CONT performs processes same as those of the above-described steps SA2 to SA6, under a second condition different from the first condition.

Specifically, the control unit CONT synchronously moves the mask stage MST and the substrate stage PST while supplying $B_2$ (liters) of the liquid LQ into the optical path space K1 per unit time by using the liquid immersion mechanism 1; and the control unit derives, based on the measurement result of the interferometer system 90 measured at this time, the synchronization error, moving average, and moving standard deviation by associating these with each of the shot areas S1 to S21. The liquid supply amount $B_2$ in the second condition is different from the liquid supply amount $B_1$ in the first condition. Then, the control unit CONT stores in the memory MRY the synchronization errors under the second condition and the information about the moving average and moving standard deviation derived from the synchronization error. Thereafter, in the same manner, the control unit CONT performs processes same as those of the Steps SA3 to SA6 under each of arbitrary N conditions (supply amounts $B_1$ to $B_N$) different from each other. The control unit CONT stores in the memory MRY the synchronization error under each of the conditions and the information about the moving average and moving standard deviation derived from the synchronization error (Steps SA7 and SA10).

The control unit CONT determines an exposure condition for exposing the substrate P to producing a device, based on at least one of the stored pieces of information stored in the memory MRY, namely, at least one of the informations about the synchronization error, moving average, and moving standard deviation (Step SA8).

That is, when the predetermined condition (here, liquid supply amount per unit time) is changed, there is a possibility that, for example, the force acting on an object(s) in contact with the liquid LQ (the substrate P, the upper surface 87 of the substrate stage PST, the first optical element LS1, the nozzle member 70, etc.), vibration states thereof and/or the like is fluctuated. Then, there is a possibility that, accompanying with the fluctuation of the force acting on the object, vibration states, etc., the synchronization error, moving average, and moving standard deviation are fluctuated. Therefore, the control unit CONT determines an optimal exposure condition (liquid supply amount per unit time), based on at least one of the synchronization error, the moving average, and the moving standard deviation stored in Step SA6. Namely, the control unit CONT determines the optimal exposure condition under each of the conditions.

The above-described moving average corresponds to a deviation component of low frequency in synchronization, and based on the moving average, the influence of the synchronization error on a position deviation of the image of the pattern which is projected on the substrate P, namely the influence on a dynamic distortion of the image of the pattern can be evaluated quantitatively to some extent. The above-described moving standard deviation corresponds to a deviation component of high frequency in synchronization, and based on the moving standard deviation, the influence of the synchronization error on deterioration of resolution power of the image of the pattern projected on the substrate P and deterioration of the image contrast (resolution) can be evaluated quantitatively to some extent.

In Step SA8, it is allowable that a condition in which each of the synchronization error, moving average, and moving standard deviation is relatively small is determined as the exposure condition; or it is allowable that important error information (here, one or two pieces of error information) is selected among the synchronization error, moving average and moving standard deviation, and a condition in which the selected error or errors are the smallest is determined as the exposure condition.

Then, based on the determined exposure condition, the control unit CONT exposes the substrate P for producing a device (Step SA9). Upon performing exposure for the substrate P for producing the device, the control unit CONT loads the substrate P for the device production on the substrate stage PST. Then, under the exposure condition determined in Step SA8, the control unit synchronously moves the mask stage MST which holds the mask M having the pattern and the substrate stage PST which holds the substrate P with respect to the Y axis direction. With this, in synch with the mask M being scanned in the +Y direction (or −Y direction) with respect to the slit-shaped illumination area MR which is illuminated by the exposure light beam EL, the substrate P is scanned in the −Y direction (or +Y direction) with respect to the projection area AR conjugate to the illumination area MR at a speed corresponding to the reduction magnification β of the projection optical system PL, and the pattern formed on the pattern forming area of the mask M is successively transferred onto the shot areas of the substrate P. When exposure of one shot area is finished, the control unit CONT moves the substrate stage PST by a predetermined distance in the non-scanning direction (X axis direction) and performs a stepping operation for the substrate stage PST to the next shot scanning start position, and then performs scanning exposure, thereby thus performing the exposure in the step-and-scan manner.

It is described above by way of example that as the exposure condition (supply condition), the liquid supply amount per unit time is determined, and the substrate P is exposed based on the determined exposure condition. However, there is a possibility that the synchronization error fluctuates also depending on the difference in other liquid immersion condition(s) as well. For example, since there is a possibility that the synchronization error fluctuates depending on liquid supply amounts per unit time from the plurality of supply ports 12, the control unit CONT can determine an optimal exposure condition including liquid supply amounts per unit time from the supply ports 12, by performing processes same as those of above-described Steps SA2 to SA6 while changing the liquid supply amounts per unit time from the supply ports 12, thereby making it possible to expose the substrate P based on the determined exposure condition.

There is also a possibility that the synchronization error fluctuates depending on a recovery condition for recovering the liquid LQ. The recovery condition include, for example, a liquid recovery amount per unit time. In this embodiment, although a porous member is provided at the recovery port 22 and the liquid immersion mechanism 1 is capable of recovering only the liquid LQ from the recovery port 22, there is a possibility that, through the recovery port 22, the liquid LQ and gas or gases together with the liquid LQ. Therefore, the recovery condition includes a ratio of the liquid and the gas when the liquid LQ is recovered from the recovery port 22. The control unit CONT determines the optimal exposure condition including the recovery condition by performing the processes same as those of above-described Steps SA2 to SA6 while changing the recovery condition, and thus the control unit CONT make it possible to expose the substrate P based on the determined exposure condition.

Also, there is a possibility that the synchronization error fluctuates when at least one of the liquid supply position and recovery position is changed. Therefore, when at least one of the liquid supply position and recovery position is changeable (variable), the control unit CONT can determine the optimal exposure condition by performing the same processes as those of Steps SA2 to SA6 described above while changing at least one of the liquid supply position and recovery position.

Further, there is also a possibility that the synchronization error fluctuates when the flow direction of the liquid LQ in the projection area AR is changed. The flow direction of the liquid LQ in the projection area AR can be changed by changing, for example, at least one of the supply position and the recovery position of the liquid. Accordingly, when the flow direction of the liquid LQ is variable, the control unit CONT can determine optimal exposure condition by performing the same processes as those of the above-described Steps SA2 to SA6 while changing the flow direction of the liquid.

Figure 9:
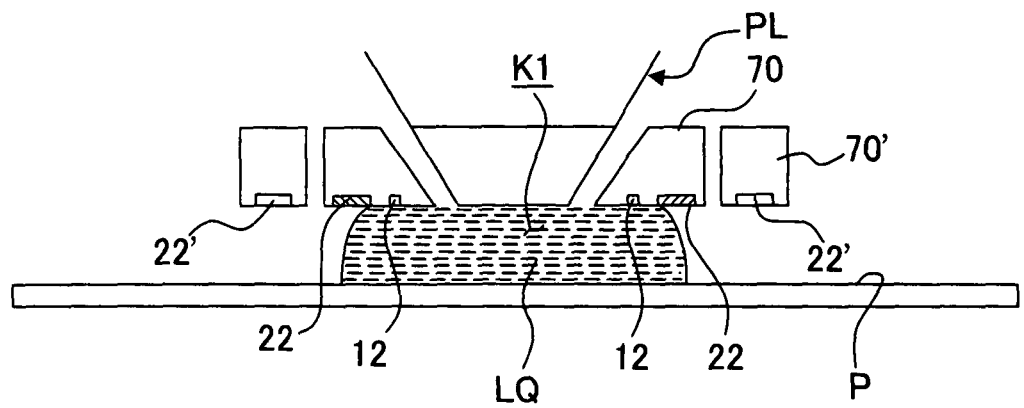
FIG. 9 is a view for explaining an example of exposure condition.

Furthermore, as schematically shown in FIG. 9, a construction is conceivable in which a second nozzle member 70' which has a second recovery port 22' different from the recovery port 22 is provided to surround the nozzle member 70. Here, the second recovery port 22' is provided for recovering the liquid LQ which cannot be successfully recovered through the recovery port 22, thereby preventing the liquid LQ in the optical path space K1 from leaking. Then, there is a possibility that the synchronization error fluctuates depending on a recovery condition including the sucking force through the second recovery port 22'. The control unit CONT can determine optimal exposure condition including the recovery condition through the second recovery port 22', thereby making it possible to expose the substrate P based on the determined exposure condition.

Figure 10:
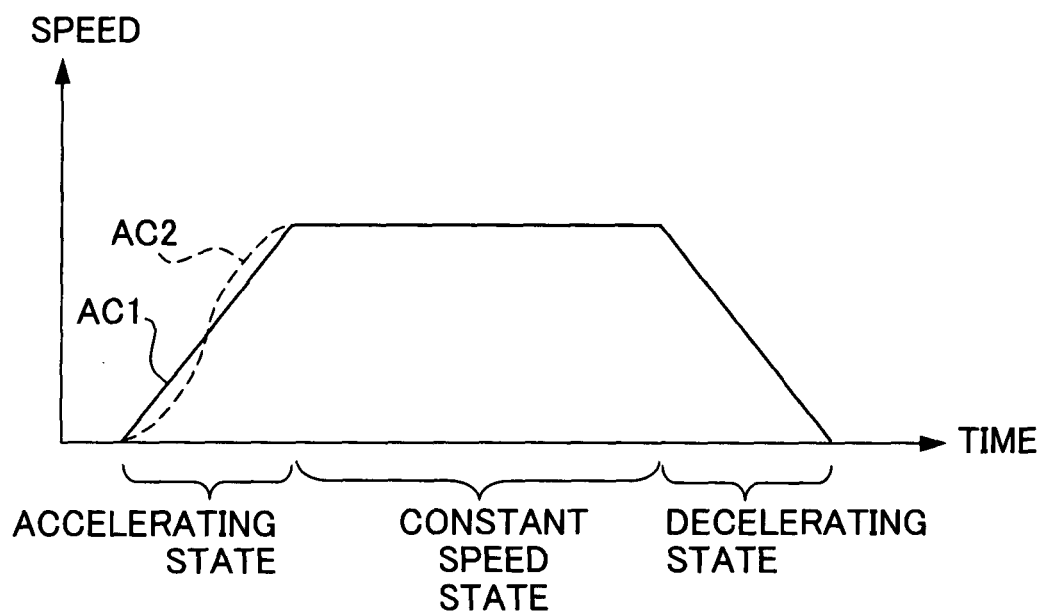
FIG. 10 is a diagram for explaining an example of exposure condition.

Moreover, there is a possibility that the synchronization error fluctuates depending on a moving condition of the substrate P. The moving condition of the substrate P includes at least one of the moving speed, the accelerating/decelerating speed, and the moving direction (moving locus) of the substrate P. FIG. 10 is a graph showing an example of the movement state of the substrate P when scanning exposure is performed for one shot area, and in the graph the horizontal axis indicates time and the vertical axis indicates the speed of the substrate P. As shown in FIG. 10, upon performing the scanning exposure for one shot area, with respect to the Y axis direction, the substrate P (substrate stage PST) moves so that the substrate P is firstly in an accelerating state in which the substrate is moving while accelerating, then in a constant-speed state in which the substrate is moving at a constant speed, and then in a decelerating state in which the substrate is moving while decelerating with respect to the Y axis direction, in this order. The control unit CONT determines optimal exposure condition including the moving speed of the substrate P by, for example, performing the same processes as those of the above-described Steps SA2 to SA6 while changing the moving speed of the substrate P, thereby making it possible to expose the substrate P based on the determined exposure condition.

Also, there is a possibility that the synchronization error fluctuates depending on the accelerating state of the substrate P. Specifically, there is a possibility that the synchronization error in the constant speed state fluctuates depending on the acceleration of the substrate P in the accelerating state. The control unit CONT determines optimal exposure condition including the acceleration of the substrate P by performing the same processes as those of the above-described Steps SA2 to SA6 while changing the acceleration of the substrate P, thereby making it possible to expose the substrate P based on the determined exposure condition. In FIG. 10, between a case in which the substrate P accelerated with a first acceleration profile AC1 and a case in which the substrate is accelerated with a second acceleration profile AC2, there is a possibility that even if the moving speed is the same between these cases in a subsequent constant speed state, the synchronization error in the constant speed state are different between these cases. Accordingly, the control unit CONT determines optimal exposure condition including the acceleration profile of the substrate P by performing the same processes as those of the above-described Steps SA2 to SA6 while changing the acceleration profile of the substrate P, thereby making it possible to expose the substrate P based on the determined exposure condition.

Similarly, since there is a possibility that the synchronization error in the constant speed state fluctuates depending on the decelerating state (including at least one of deceleration and deceleration profile), the control unit CONT determines optimal exposure condition including the decelerating state of the substrate P by performing the same processes as those of Steps SA2 to SA6 while changing the delegating state of the substrate P, thereby making it possible to expose the substrate P based on the determined exposure condition.

Further, since there is a possibility that the synchronization error fluctuates also depending on the moving direction (moving locus) of the substrate P with respect to the optical path space K1, the control unit CONT determines optimal exposure condition including the moving direction (moving locus) of the substrate P by performing the same processes as those of Steps SA2 to SA6 described above while changing the moving direction (moving locus) of the substrate P, thereby making it possible to expose the substrate P based on the determined exposure condition. It should be noted that the moving direction (moving locus) of the substrate P includes, for example, the moving direction (+Y direction, −Y direction) of the substrate P at the time of the scanning exposure for each of the shot areas, the moving direction, moving distance and moving path of the substrate P during the stepping movement, etc.

Figure 11:
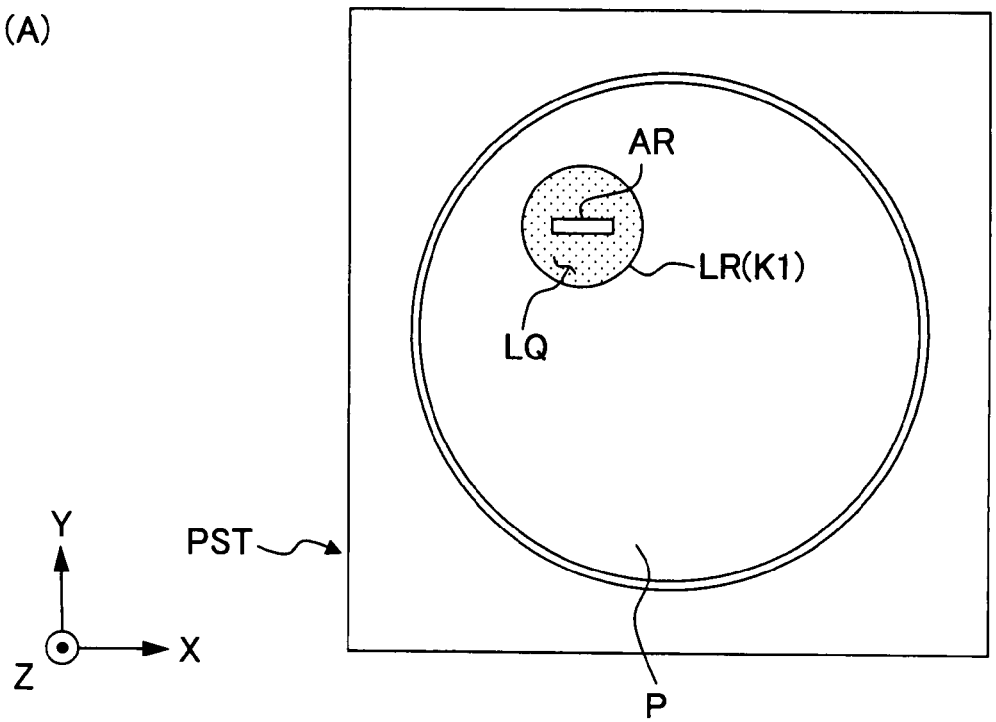
FIGS. 11(A) and 11(B) are views for explaining an example of exposure condition.
Figure 11:
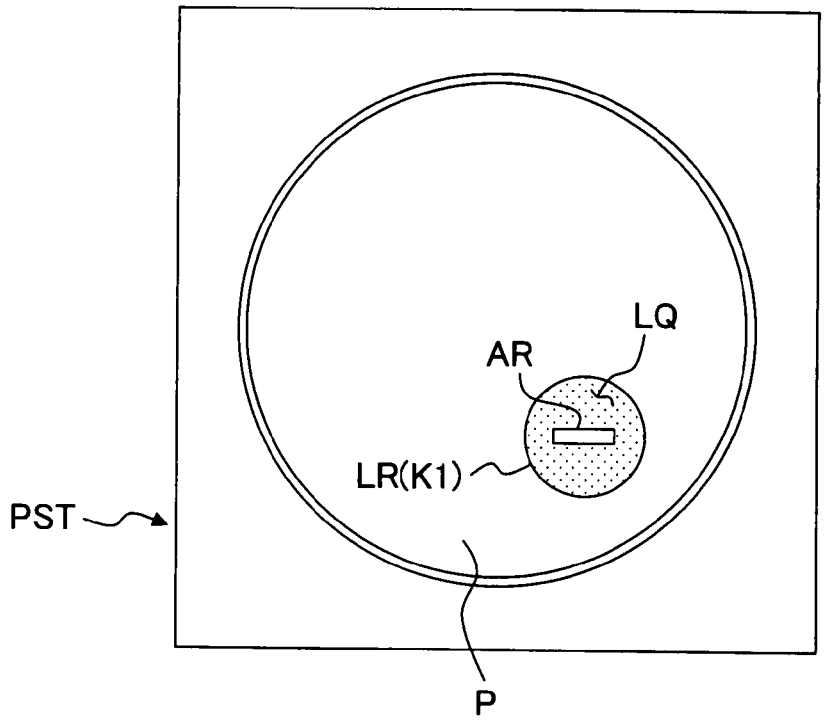

Furthermore, there is a possibility that the synchronization error fluctuates depending on the positional relationship between the optical path space K1 and the substrate stage PST (substrate P). Namely, there is a possibility that, depending on the positional relationship between the optical path space K1 and the substrate stage PST, the position of the center of gravity of the substrate stage PST, including the liquid LQ filled in the optical path space K1, fluctuates, and that the synchronization error fluctuates accompanying with this fluctuation of the position of the center of gravity. It should be noted that, for example, the position of the center of gravity of the substrate stage PST including the liquid LQ is different between a case in which the optical path space K1 (liquid LQ) and the substrate stage PST have a positional relationship as shown in FIG. 11(A) and in a case in which the optical path space K1 (liquid LQ) and the substrate stage PST have a positional relationship as shown in FIG. 11(B). FIG. 11(A) shows a state in which the scanning exposure is performed, for example, in the vicinity of the seventh shot area S7, and FIG. 11(B) shows a state in which the scanning exposure is performed, for example, in the vicinity of the fifteenth shot area S15. Therefore, by obtaining synchronization errors corresponding to the shot areas S1 to S21 on the substrate P as described above, it is possible to accurately evaluate the fluctuation in the synchronization error depending on the positional relationship between the optical path space K1 and the substrate stage PST.

When the synchronization errors are obtained corresponding to the shot areas S1 to S21 respectively as described above, the control unit CONT determines, based on the evaluation results of the synchronization errors corresponding to the shot areas, optimal exposure condition in the state that the liquid immersion area LR is formed for each of the shot areas S1 to S21, thereby making it possible to expose each of the shot areas S1 to S21 on the substrate P based on the determined exposure condition.

Figure 12:
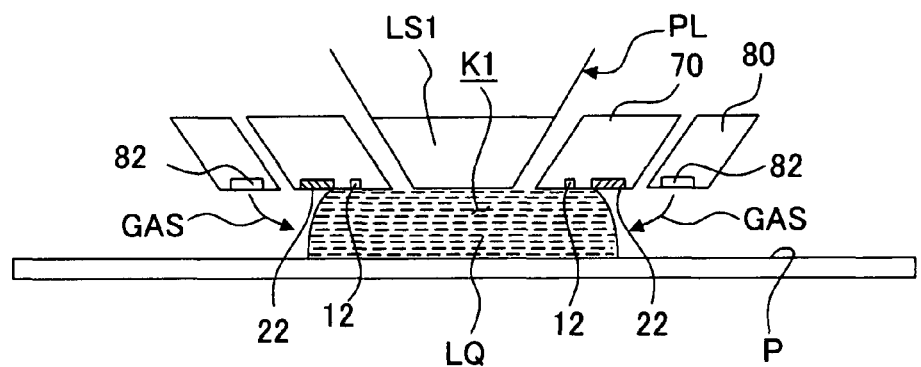
FIG. 12 is a view for explaining an example of exposure condition.

A construction, as schematically shown in FIG. 12, is conceivable that a third nozzle member 80, having a blower port 82 for blowing a gas toward the optical path space K1 from the outside of the optical path space K1, is formed to surround the nozzle member 70. The blower port 82 prevents the liquid LQ in the optical path space K1 from leaking, by blowing the gas toward the optical path space K1. There is a possibility that the synchronization error fluctuates depending on a condition for blowing the gas toward the optical path space K1 from the blower port 82. Here, the blowing condition includes a blowing amount of the gas to be blown from the blower port 82 per unit time and a blowing direction of the gas to the optical path space K1. The control unit CONT determines the exposure condition, which includes a gas-blowing condition and in which the synchronization error is the smallest, by performing the same processes as those of Steps SA2 to SA6 described above while changing the gas blowing condition, thereby making it possible to expose the substrate P based on the determined exposure condition.

Further, there is a possibility that the synchronization error fluctuates depending on a condition of an object which comes into contact with the liquid LQ. The object include the substrate P held on the substrate stage PST and a member (upper surfaces 87 of the substrate stage PST, etc.) disposed around the substrate P held on the substrate stage PST. Also, the condition for object (objection condition) includes a condition concerning a contact angle (including a sliding angle) with the liquid LQ.

Figure 13:
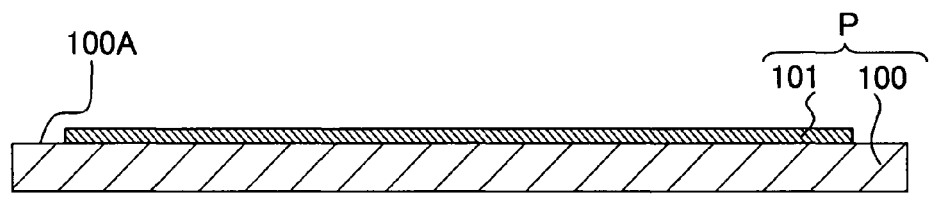
FIGS. 13(A) and 13(B) are views for explaining an example of exposure condition.
Figure 13:
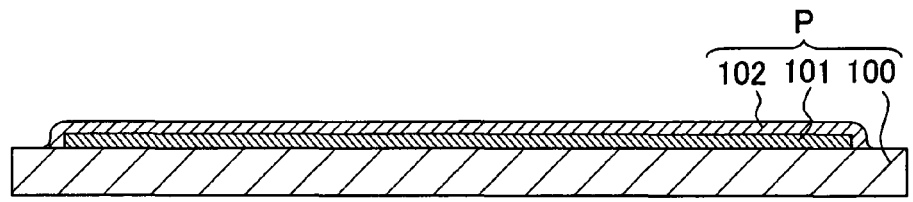

FIG. 13(A) shows an example of a sectional view of the substrate P. In FIG. 13(A), the substrate P has a base material 100 and a film 101 provided on an upper surface 100A of the base material 100. The base material 100 includes a semiconductor wafer. The film 101 is made of a photosensitive material (resist), and coated, to a predetermined thickness, at an area occupying most of the central portion of the upper surface 100A of the base material 100. In FIG. 13(A), the photosensitive material (film) 101 on the peripheral edge of the upper surface 100A of the base material 100 is removed. In FIG. 13(A), a film (photosensitive material) 101 is provided on the uppermost layer of the substrate P, and this film 101 becomes a liquid contact surface which comes into contact with the liquid LQ at the time of performing the liquid immersion exposure.

FIG. 13(B) is a diagram showing another example of the substrate P. In FIG. 13(B), the substrate P has a second film 102 which covers a surface of the film 101. The second film 102 is made of a protective film called topcoat film. In FIG. 13(B), the second film (protective film) 102 is provided on the uppermost layer of the substrate P, and this second film 102 becomes a liquid contact surface which comes into contact with the liquid LQ at the time of performing the liquid immersion exposure.

When the film, of the substrate P, which comes into contact with the liquid LQ is changed, there is a possibility that the condition concerning the contact angle between the substrate P and the liquid LQ changes. Namely, there is a possibility that the contact angle of the substrate P with the liquid LQ is changed depending on whether the surface of the substrate P is a resist film or a topcoat film, or depending on the kind of the resist film or of the topcoat film. Since the contact angle between the liquid LQ and the substrate P becomes a factor to change the pressure of the liquid LQ, there is a possibility that the synchronization error fluctuates depending on the condition concerning the contact angle of the substrate P with the liquid LQ.

Therefore, as in the above-described embodiment, by obtaining the synchronization error in the state that the liquid immersion area LR is formed on the substrate P to be used for device production, it is possible to accurately evaluate the fluctuation in the synchronization error which can be caused during the scanning exposure of the substrate P for producing the device.

Figure 14:
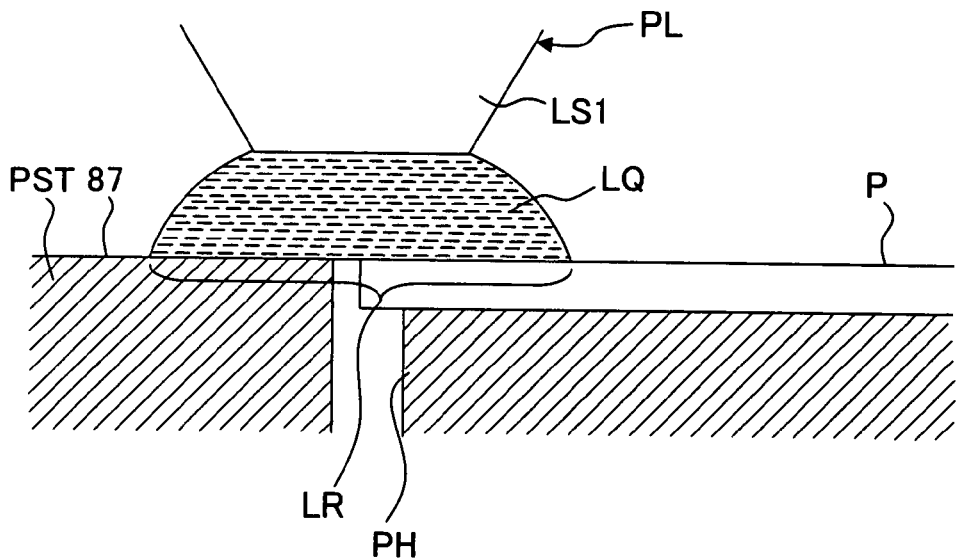
FIG. 14 is a view for explaining an example of exposure condition.

Further, upon performing the exposure for a shot area provided on the peripheral edge of the substrate P, there is a possibility that, as shown in FIG. 14, the liquid immersion area LR of the liquid LQ is formed straddling at the same time both the surface of the substrate P held on the substrate stage PST and the upper surface 87 of the substrate stage PST disposed around the substrate P held on the substrate stage PST. When the contact angle of the surface of the substrate P with (affinity for) the liquid LQ and the contact angle of the upper surface 87 of the substrate stage PST with (affinity for) the liquid LQ are different from each other, there is a possibility that the synchronization error in a state that the liquid immersion area LR is formed only on the surface of the substrate P and the synchronization error in a state that the liquid immersion area LR is formed at the same time both on the surface of the substrate P and the upper surface of the substrate stage PST are different from each other.

It is desired that the contact angle of the upper surface 87 of the substrate stage PST with the liquid LQ is not less than 100 degrees (for example, 100 degrees to 130 degrees). It should be noted, however, that the contact angle of the surface of the substrate P with the liquid LQ can vary in a range of, for example, 30 degrees to 110 degrees depending on the film (protective film, photosensitive material) on the surface of the substrate P to be loaded on the substrate stage PST. Therefore, there is a possibility that the synchronization error is influenced (affected) by the difference between the contact angle of the upper surface 87 of the substrate stage PST with the liquid LQ and the contact angle of the surface of the substrate P with the liquid LQ.

Therefore, it is desired that the synchronization error is measured even for the state in which the liquid immersion area LR is formed straddling the surface of the substrate P and the upper surface 87 of the substrate stage PST. For example, the control unit CONT can determine an optimal condition for exposing a shot area located in the vicinity of the peripheral edge of the substrate P by performing the same processes as those of the above-described Steps SA2 to SA6 while changing the liquid immersion condition and the moving condition of the substrate P (substrate stage PST) etc., in the state in which the liquid immersion area LR is formed straddling the surface of the substrate P and the upper surface 87 of the substrate stage PST.

In addition, it is also allowable that the control unit CONT makes the condition for exposing the substrate P in the state that the liquid immersion area LR is formed only on the surface of the substrate P to be different from a condition for exposing the substrate P in the state that the liquid immersion area LR is formed across (straddling) both the surface of the substrate P and the upper surface of the substrate stage PST from each other so as to reduce both of the synchronization error in the state that the liquid immersion area LR is formed only on the surface of the substrate P and the synchronization error in the state that the liquid immersion area LR is formed across the surface of the substrate P and the upper surface of the substrate stage PST.

The control unit CONT can determine optimal exposure condition including the condition concerning the contact angle of the upper surface 87 of the substrate stage PST with the liquid LQ by performing the same processes as those of the above-described Steps SA2 to SA6 while changing the contact angle of the upper surface 87 of the substrate stage PST with the liquid LQ, thereby making it possible to expose the substrate P based on the determined exposure condition.

When the contact angle of the upper surface 87 of the substrate stage PST with the liquid LQ is to be changed, it is allowable, for example, to coat on the upper surface 87 a predetermined material having a property (contact angle) different from that of the predetermined material already coated on the upper surface 87, thereby changing the contact angle. Alternatively, it is also possible to change the contact angle of the upper surface 87 of the substrate stage PST with the liquid LQ by preparing a plurality of plate members, which have mutually different contact angles and each of which is for forming the upper surface 87, to be exchangeable with the base material of the substrate stage PST, and by arranging each of the plurality of plate members upon changing the contact angle of the upper stage 87. Still alternatively, it is allowable to perform, for the upper surface 87 of the substrate stage PST, a mechanical treatment such as plasma treatment or perform chemical treatment using a chemical. When the contact angle of the upper surface 87 of the substrate stage PST with the liquid LQ is changeable, it is possible to uniformize the contact angle distribution on the substrate stage PST including the surface of the substrate P, by setting the contact angle of the upper surface 87 of the substrate stage PST with the liquid LQ and the contact angle of the surface of the substrate P with the liquid LQ to be almost equal to each other. Accordingly, it is possible to make the difference to be small between the synchronization error in the state that the liquid immersion area LR is formed only on the surface of the substrate. P and the synchronization error in the state that the liquid immersion area LR is formed at the same time on the surface of the substrate P and the upper surface of the substrate stage PST.

Although the conditions, such as the liquid immersion condition and substrate-moving condition which can fluctuate the synchronization error, are listed as described above, it is allowable that the change in the synchronization error is not measured and evaluated in all of these conditions, and it is allowable that the synchronization error is measured, as necessary, while changing one of these conditions or changing each of the conditions to thereby determine the optimal exposure condition for the substrate P.

In addition, as described in the embodiment above, it is desirable that the synchronization error is obtained in the state that the substrate P to be used for real exposure for device production is held on the substrate stage PST and the optimal exposure condition is determined. It is also allowable, however, that a substrate for evaluation (evaluation-substrate), which is different from the substrate P to be used for real exposure, is held on the substrate stage PST and the synchronization error is obtained. In this case, it is allowable that a evaluation-substrate having a film formed on the surface same as that formed on the substrate P is held on the substrate stage PST and the synchronization error is obtained. As described above, since there is a possibility that depending on the film on the surface, the contact angle with the liquid LQ changes and the way how synchronization error occurs also changes, it is also allowable that a plurality of types of evaluation-substrates having mutually different films thereon are successively held on the substrate stage PST, and to obtain the synchronization error for each of the evaluation-substrates while changing the liquid immersion condition and substrate moving condition; and then upon performing the exposure for the substrate P to be used for device production, the optimal exposure condition is determined based on the evaluation result of the synchronization error of the evaluation-substrate in the same or similar film condition as those of the surface of the substrate P.

In the above-described embodiment, although the moving average of the synchronization error and the moving standard deviation are obtained, it is also allowable that only one of these is obtained; or it is allowable to determine the exposure condition by obtaining the synchronization error as shown in FIG. 7, without obtaining both of these.

In the embodiment described above, although the exposure apparatus EX includes both of the coarse moving stage-interferometer 92 and the fine moving stage-interferometer 94, it is also allowable to omit the coarse moving stage-interferometer 92 and to control the positions of the coarse moving stage MST1 and the fine moving stage MST2 based on the measurement result of the fine moving stage-interferometer 94 (and XY interferometer 96). The controls of the mask stage MST (coarse moving stage MST1 and the fine moving stage MST2) and the substrate stage PST are not limited to those described above, and various control methods can be used. Furthermore, it is also allowable that a fine moving stage which is finely movable in the X axis, Y axis, and θZ directions is provided on the substrate stage PST, and the control unit CONT drives the fine moving stage of the substrate stage PST instead of or in combination with the fine moving stage MST2 so as to make the relative position error between the mask M and the substrate P to be small during the scanning exposure. Furthermore, it is allowable that the substrate holder PH is formed integrally with a part (for example, a table which is finely moved in the Z axis, θX, and θY directions) of the substrate stage PST.

In the above-described embodiment, although the mask stage MST has the coarse moving stage MST1 and the fine moving stage MST2, it is also possible to use, as disclosed in the pamphlet of International Publication No. 2004/073053 (corresponding to United States Patent Application Publication No. 2005/0248744), a mask stage which is not separated into the coarse moving stage and the fine moving stage.

In the embodiment described above, although the synchronization error is obtained in the state that the mask M to be used for real exposure for device production is held on the mask stage MST, it is allowable to use a mask different from that used for real exposure, and it is allowable to place or load nothing on the mask stage MST.

In the embodiment described above, although the synchronization error is obtained corresponding to each of the shot areas S1 to S21 defined in the shot area arrangement when exposing the substrate P, it is also allowable to obtain the synchronization error corresponding to at least one a part of the shot areas (for example, the shot area S1, S3, S19, and S21 on the four corners of FIG. 3, and the central shot area S11). Further, it is also allowable to obtain the synchronization error at a predetermined position (preferably at a plurality of positions) on the substrate P, rather than using the arrangement information of the shot areas at the time of exposure of the substrate P.

Second Embodiment

In the foregoing, although the explanation was given about a case, by way of example, in which the movement control accuracy in the XY directions of the substrate stage PST, namely the synchronization error of synchronized movements of the mask stage MST and the substrate stage PST in the Y axis direction is evaluated to determine the optimal exposure condition, there is a possibility that the movement control accuracy in the Z axis direction of the substrate stage PST fluctuates (deteriorates) due to the liquid LQ filled in the optical path space K1. In the following description, the movement control accuracy in the Z axis direction of the substrate stage PST will be referred to as "focus control accuracy (error)" as appropriate.

In the second embodiment, the control unit CONT obtains the focus control accuracy of the substrate stage PST and determines exposure condition which makes the focus control accuracy (error) to be small. Here, the focus control accuracy of the substrate stage PST includes a position error between a predetermined surface on the substrate stage PST and a target surface with which the predetermined surface is to be matched. The predetermined surface on the substrate stage PST includes a surface of the substrate P held on the substrate stage PST or the upper surface 87 of the substrate stage PST disposed around the substrate P held on the substrate stage PST. In some cases, a measuring unit concerning the exposure process may be provided around the substrate P held on the substrate stage PST (the upper surface 87 of the substrate stage PST, etc.).

Upon exposing the substrate P, the control unit CONT detects position information of the surface of the substrate P by using the focus/leveling-detecting system 30, and based on the detection result, the control unit controls the substrate stage PST so as to match the surface of the substrate P and an image plane formed via the projection optical system PL and the liquid LQ filled in the optical path space K1. Here, the position information of the image plane formed via the projection optical system PL and the liquid LQ is obtained in advance, and the control unit CONT performs position control in the Z axis direction, θX direction, and θY direction of the substrate stage PST based on the detection result of the focus/leveling-detecting system 30, so as to match the image plane obtained in advance and the surface of the substrate P. However, even when the control unit CONT performs position control of the substrate stage PST so as to match the image plane and the surface of the substrate P held on the substrate stage PST, there is still a possibility that a position error occurs between the image plane and the surface of the substrate P held on the substrate stage PST.

Accordingly, in the second embodiment, similarly to the first embodiment, the control unit CONT obtains focus control accuracy of the substrate stage PST under each of the plurality of conditions before performing real exposure of the substrate P, and evaluates the focus control accuracy under each of the conditions, and determines optimal exposure condition which improves the focus control accuracy (that is, makes the focus control error to be small).

For simplicity, also in the second embodiment, an explanation will be given about a case by way of example in which the liquid supply amount per unit time is determined as the exposure condition.

First, the control unit CONT synchronously moves the mask stage MST and the substrate stage PST so as to perform the scanning exposure for the shot area S1 on the substrate P under a first condition that $B_1$ (liters) of the liquid LQ is supplied to the optical path space K1 per unit time by using the liquid immersion mechanism 1, and performs position control in the Z axis direction, θX direction, and θY direction of the substrate stage PST based on the detection result of the focus leveling-detecting system 30. Further, the control unit CONT obtains a deviation amount (remaining error), remaining after the position control, between the surface of the substrate P and the image plane in the projection area AR, at predetermined sampling intervals. The control unit CONT stores the obtained remaining error as the focus control accuracy in the memory MRY by associating the remaining error with a time elapsed from the exposure start point of the shot area S1 as the reference (or the position on the wafer at the exposure start point of the shot area S1).

Similarly, the control unit CONT synchronously moves the mask stage MST (fine moving stage MST2) and the substrate stage PST while performing the position control in the Z axis direction, θX direction, and θY direction of the substrate stage PST based on the detection result of the focus leveling-detecting system 30 so as to successively scan and expose the remaining shot areas S2 to S21, and stores focus control accuracies (remaining errors) corresponding to the remaining shot areas S2 to S21 respectively in the memory MRY.

After obtaining the focus control accuracies (remaining errors) in the first condition in this manner, the control unit CONT obtains focus control accuracies (remaining errors) corresponding to the shot areas S1 to S21 under a second condition (liquid supply amount per unit time: $B_2$ (liters)) and stores the obtained focus control accuracies in the memory MRY. Subsequently, in the same manner, the control unit CONT obtains focus control accuracies (remaining errors) corresponding to shot areas S1 to S21 under N pieces of conditions (liquid supply amount per unit time: $B_1$ to $B_N$) which are mutually different, and stores the obtained focus control accuracies in the memory MRY.

The control unit CONT determines optimal exposure condition for exposing the substrate P for device production, based on the focus control accuracies (remaining errors) stored in the memory MRY.

That is, when the condition (for example, liquid supply amount per unit time) when synchronously moving the mask stage MST and the substrate stage PST in the state that the liquid immersion area LR are formed is changed, there is a possibility that, similar to the synchronization error described in the first embodiment, the focus control accuracy (remaining error) fluctuates. Therefore, optimal exposure condition including a liquid supply amount per unit time are determined based on the focus control accuracies stored in the memory MRY, such that the focus remaining error are made to be small.

Then, the control unit CONT performs the exposure for the substrate P for device production in the step-and-scan manner, based on the determined exposure condition.

Similar to the first embodiment, there is a possibility that the focus control accuracy changes depending on various conditions such as other liquid immersion condition and the moving condition of the substrate (substrate stage PST), as well as depending on the liquid supply amount per unit time. Therefore, it is preferable that at least one of the various conditions listed in the first embodiment is selected as appropriate, and the focus control accuracy (remaining error) is obtained while changing the selected condition or conditions to determine optimal exposure condition.

In the explanation given above, although the focus control accuracy (remaining error) is obtained while performing the position control in the Z axis direction, θX direction, and θY direction of the substrate stage PST based on the detection result of the focus/leveling-detecting system 30, it is also possible to sue the Z interferometer 98. The position information in the Z axis direction, θX direction, and θY direction of the substrate stage PST are measured by the Z interferometer 98. Therefore, the control unit CONT can perform position control of the substrate stage PST and obtain focus control accuracy of the substrate stage PST based on the measurement result of the Z interferometer 98. For example, by obtaining information regarding the surface state of the substrate P (surface unevenness information of the substrate P) in advance, the control unit CONT can obtain focus control accuracy of the substrate stage PST from the detection result of the focus/leveling-detecting system 30 while performing position control of the substrate stage PST based on the measurement result of the Z interferometer 98 so as to match the surface of the substrate P and the image plane obtained in advance and formed via the projection optical system PL and the liquid LQ.

It is also allowable to obtain the focus control accuracy of the substrate stage PST from the measurement result of the z interferometer 98 while performing position control in the Z axis direction, θX direction, and θY direction of the substrate stage PST based on the detection result of the focus/leveling-detecting system 30.

Further, the control unit CONT can perform position control of the substrate stage PST based on the position information in the Z axis, θX, and θY directions of the surface of the substrate P on the substrate stage PST detected by using the focus/leveling-detecting system 30 and based on the position information in the Z axis, θX, and θY directions of the substrate stage PST detected by using the Z interferometer 98, and can obtain the focus control accuracy based on at least one of the detection result of the focus/leveling-detecting system 30 and the measurement result of the Z interferometer 98.

It is also allowable to omit the focus/leveling-detecting system 30 which is capable of detecting the surface position of the substrate P (upper surface 87 of the substrate stage PST) in real time, and to obtain the focus control accuracy of the substrate stage PST from the measurement result of the Z interferometer 98 while performing the position control in the Z axis direction, θX direction, and θY direction of the substrate stage PST based on the measurement result of the Z interferometer 98.

As in the second embodiment described above, when using the substrate P to be used for exposure for device production, it is possible to obtain the focus control accuracy including the influences by the film on the surface of the substrate P, by the unevenness of the surface of the substrate P, and/or the like. Therefore, although more optimal exposure condition can be determined, it is also allowable as described in the first embodiment that a evaluation-substrate used for the evaluation and different from the substrate P used for real exposure is held on the substrate stage PST and the focus control accuracy is obtained.

In the second embodiment described above, although the mask stage MST and the substrate stage PST are synchronously moved for the purpose of obtaining the focus control accuracy, it is allowable to move only the substrate stage PST to obtain the focus control accuracy.

In the second embodiment, although only the focus control accuracy is explained, it goes without saying that it is allowable to obtain the focus control accuracy (remaining error) concurrently when the synchronization error (including at least one of the moving average and the moving standard deviation) described in the first embodiment is obtained.

Third Embodiment

In the above-described first and second embodiments, although the synchronization error and the focus control accuracy are obtained based on the measurement result of the interferometer system 90 and the detection result of the focus/leveling-detecting system 30, it is also allowable that a test-exposure is performed for the substrate P under the various conditions as described above, and to evaluate the synchronization error and the focus control error accuracy based on the exposure results.

Figure 15:
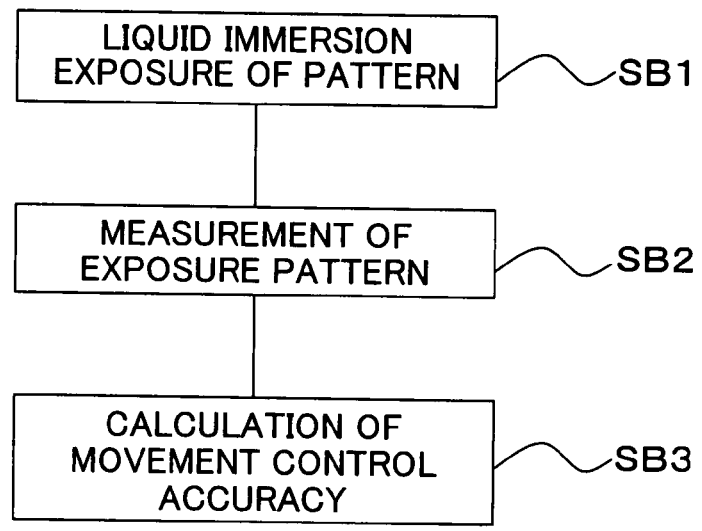
FIG. 15 is a flowchart showing an evaluating method for evaluating movement control accuracy using test-exposure in a third embodiment.
Figure 16:
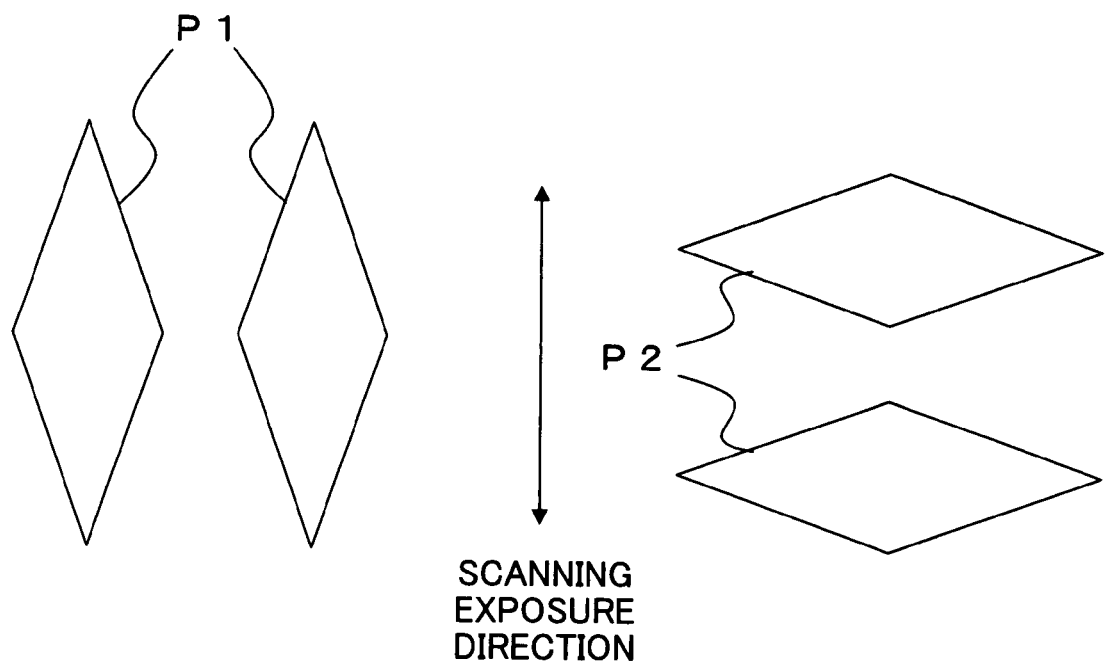
FIG. 16 is a view of a shape of a pattern used for the test-exposure in the third embodiment.

The flowchart of FIG. 15 shows steps of evaluation of the movement control accuracy in a test liquid immersion exposure. In this method, a test-exposure is performed under the exposure condition including the liquid immersion condition by using a predetermined pattern (SB1). As this pattern, it is possible to use in combination, for example, a wedge-shaped first pattern P1 of which longitudinal direction is substantially in the scanning direction and a wedge-shaped second pattern P2 of which longitudinal direction is substantially orthogonal to the scanning direction as shown in FIG. 16. Next, the obtained test patterns on the substrate are developed and the shapes or sizes of the patterns P1 and P2 are measured (SB2). Lastly, the movement control accuracy such as the synchronization error and the focus control accuracy can be determined or evaluated based on the measurement result. It is known that the length of the first pattern P1 is mainly influenced by synchronization deviation in a direction orthogonal to the scanning direction, and that the length of the second pattern P2 is mainly influenced by synchronization deviation in the scanning direction. Therefore, by obtaining the dimension of the first pattern P1 under each of the different exposure conditions, it is possible to obtain the synchronization error due to the difference in the exposure condition, in particular, due to the difference in the liquid immersion condition. Further, by comparing the lengths of the first pattern P1 and the second pattern P2 from the difference in lengths and the ratio of these patterns, it is possible to eliminate the influence due to the change in the dimension of the resist pattern caused by fluctuation of the developing process, to thereby makes it possible to obtain the synchronization error between the mask and the substrate further accurately. Japanese Patent Application Laid-open No. 11-354420 discloses an example of a method for measuring the synchronization error by measuring the length of the pattern on the test-exposed substrate. Here, although a pattern (resist image) which is obtained by developing the test-exposed substrate is measured, the measurement is not limited to this. It is allowable, for example, measure a pattern (latent image) formed on the substrate by the test-exposure without performing the development or to measure a pattern obtained through development and etching.

As described above, the synchronization error and the focus control accuracy change depending on various conditions. To optimize these various conditions, for example, first, a film on the surface of the substrate P is determined according to the process. Under a condition concerning the determined film on the surface of the substrate P, optimal moving condition and liquid immersion condition, etc., of the substrate P are determined such that the liquid LQ can be held in the optical path space K1 (without the leakage of the liquid LQ) and that various performances such as synchronization error, focus control accuracy, image forming performance and the like are made to be ideal.

A parameter of the image forming performance can be exemplified by wavefront aberration of the image of the pattern formed via the projection optical system PL and the liquid LQ. When the liquid immersion condition is changed, there is a possibility that the wavefront aberration of the image of the pattern formed via the projection optical system PL and the liquid LQ is fluctuated. It is possible to perform, for example, as described above, test-exposure under the various conditions as described above; to obtain the synchronization error and the focus control accuracy based on the measurement result of the pattern shape formed on the substrate P obtained through the test-exposure; and to obtain the exposure condition which makes the wavefront aberration to be in an ideal state. Upon obtaining the wavefront aberration, it is allowable to use a predetermined measuring instrument for measuring wavefront aberration as disclosed, for example, in the pamphlet of International Publication No. 2005/043607.

As described above, by measuring the position information of the substrate P (substrate stage PST) while moving the substrate stage PST in the state that the optical path space K1 for the exposure light beam EL is filled with the liquid LQ under a plurality of conditions, it is possible to evaluate the influences of the liquid LQ on the movement control accuracy of the substrate stage PST under each of the conditions and to obtain the movement control accuracies of the substrate stage PST under the conditions, respectively. Then, based on the obtained movement control accuracies, the optimal exposure condition can be determined. Then, based on the determined exposure condition, the substrate P can be satisfactorily exposed. This makes it possible to avoid the occurrence of any exposure failure which would be otherwise caused due to the movement control accuracy of the substrate stage PST.

As described above, pure or purified water is used as the liquid LQ in the above-described embodiments. Pure or purified water can be easily acquired in large quantities in a semiconductor manufacturing factory or the like, and advantageous since the pure or purified water has no harmful influences on the photoresist on the substrate P and the optical element (lens), etc. The pure water or purified water has no harmful influence on the environment, and has a very low content of impurities, so that it is expected to clean (wash) the surface of the substrate P and the surface of the optical element provided on the end surface of the projection optical system PL. When the purity of the pure or purified water supplied from the factory or the like is low, the exposure apparatus may be provided with an ultrapure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In the embodiments described above, the optical element LS1 is attached to the end portion of the projection optical system PL, and it is possible to adjust, with this lens, the optical characteristics, for example, aberrations (spherical aberration, coma aberration, etc.,) of the projection optical system PL. The optical element to be attached to the end portion of the projection optical system PL may also be an optical plate used for adjusting the optical characteristics of the projection optical system PL. Alternatively, the optical element may be a plane-parallel through which the exposure light beam EL is transmissive.

When the pressure between the optical element at the end portion of the projection optical system PL and the substrate P generated due to the flow of the liquid LQ is great, the optical element may be firmly fixed so as not to be moved by the pressure, instead of making the optical element exchangeable. The structure of the liquid immersion mechanism 1 including the nozzle member 70, etc., is not limited to the above-described structure, and it is also possible to use for example, the structures described in European Patent Publication No. 1420298 and International Patent Publication Nos. 2004/055803, 2004/057590, and 2005/029559.

In the embodiments described above, although the liquid LQ is filled between the projection optical system PL and the surface of the substrate P, it is also allowable that the liquid LQ is filled in a state that, for example, a cover glass formed of a plane-parallel is attached to the surface of the substrate P.

In the above-described embodiments, although the projection optical system fills, with the liquid, the optical path space on the side of the image plane of the optical element on the end portion, it is also possible to adopt a projection optical system which also fills, with a liquid, the optical path space on a side of the mask on the end portion optical element as disclosed in pamphlet of International Publication No. 2004/019128.

Although the liquid LQ in the above-described embodiments is water (pure or purified water), the liquid may be a liquid other than water. For example, when the light source of the exposure light beam EL is the $F_2$ laser, the $F_2$ laser beam is not transmitted through water. Therefore, the liquid LQ may be a fluorine-based liquid including, for example, perfluoropolyether (PFPE) and fluorine-based oil through which the $F_2$ laser beam is transmissive. In this case, the portion, which makes contact with the liquid LQ, is subjected to the liquid-attracting treatment, for example, by forming a thin film with a substance having a molecular structure with small polarity including fluorine. Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL. Also, as the liquid LQ, it is possible to use a liquid with a refractive index of approximately 1.6 to 1.8. Further, the optical element LS1 may be made of a material with a refractive index (for example, not less than 1.6) higher than that of silica glass and calcium fluoride. Various liquids such as a supercritical fluid may also be used as the liquid LQ. In the above-described embodiments, although the interferometer system 90 is used to measure the position informations of the mask stage MST and of the substrate stage PST, the measurement is not limited to this, and it is allowable to use, for example, an encoder system. When the encoder system is used to measure the position information of the substrate stage PST, it is allowable, for example, to provide a one-dimensional diffraction grating on the upper surface of the substrate stage PST along a predetermined direction, and to arrange a head unit so as to cross (intersect) the predetermined direction. Alternatively, it is allowable to adopt a hybrid system including both the interferometer system and the encoder system, and to control the positions of the mask stage MST and the substrate stage PST by using measurement result of at least one of the interferometer system and the encoder system. For example, at least during the exposure operation, the measurement result of the encoder system is used to control the positions of the stages, and during operations other than the exposure operation (substrate-exchanging operation, etc.), it is possible to control the positions of the stages by using the measurement result of the interferometer system. In this case, it is preferable that the measurement result of the encoder system are calibrated by using the measurement result of the interferometer system.

The substrate P of each of the respective embodiments is not limited to a semiconductor wafer for producing a semiconductor device. Substrates applicable include, for example, a glass substrate for the display device, a ceramic wafer for the thin film magnetic head, and a master plate (synthetic silica glass, silicon wafer) for the mask or the reticle to be used for the exposure apparatus.

As for the exposure apparatus EX, the present invention is also applicable to a scanning type exposure apparatus (scanning stepper) based on the step-and-scan system for performing the scanning exposure for the pattern of the mask M by synchronously moving the mask M and the substrate P as well as a projection exposure apparatus (stepper) based on the step-and-repeat system for performing the full field exposure with the pattern of the mask M in a state in which the mask M and the substrate P are allowed to stand still, while successively step-moving the substrate P by using the substrate stage or the like.

As for the exposure apparatus EX, the present invention is also applicable to an exposure apparatus of the system in which the substrate P is subjected to the full field exposure by using a projection optical system (for example, a dioptric type projection optical system including no catoptric element with a reduction magnification of ⅛) with a reduction image of a first pattern in a state in which the first pattern and the substrate P are allowed to substantially stand still. In this case, the present invention is also applicable to a full field exposure apparatus based on the stitch system in which, subsequent to the exposure operation for the first pattern as described above, the substrate P is subjected to the full field exposure while partially overlaying a reduction image of a second pattern on the first pattern by using the projection optical system in a state in which the second pattern and the substrate P are allowed to substantially stand still thereafter. As for the exposure apparatus based on the stitch system, the present invention is also applicable to an exposure apparatus based on the step-and-stitch system in which at least two patterns are partially overlaid and transferred on the substrate P, and the substrate P is successively moved. In the exposure apparatus of each of these systems, it is possible to effectively obtain the movement control accuracy of the substrate stage upon performing the liquid immersion exposure, according to the present invention. Although each of the above-described embodiments is explained, by way of example, by the exposure apparatus provided with the projection optical system PL, the present invention is also applicable to an exposure apparatus and an exposure method which do not use any projection optical system PL. Even in the case using no projection optical system PL, the exposure light beam is irradiated onto the substrate via an optical member such as a lens, and a liquid immersion area is formed in a predetermined space between such an optical member and the substrate.

The present invention is also applicable to a twin-stage type exposure apparatus, as disclosed in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407, contents of which are incorporated herein by reference within a range of permission of the domestic laws and ordinances of the state designated or selected in this international application. In such a case, the synchronization error, etc., in the liquid immersion state may be measured on one of the substrate stages, or the synchronization error in the liquid immersion state may be measured on both of the substrate stages.

Further, the present invention is also applicable, for example, to an exposure apparatus provided with a substrate stage which holds a substrate and a measuring stage which is provided with a measuring member (for example, a reference member having a reference mark formed therein and/or various types of a photoelectric sensors) as disclosed, for example, in Japanese Patent Application Laid-open No. 11-135400 and Japanese Patent Application Laid-open No. 2000-164504 (corresponding to U.S. Pat. No. 6,897,963), contents of which are incorporated herein by reference within a range of permission of the domestic laws and ordinances of the state designated or selected in this international application.

In the above-described embodiment, although the synchronization error, etc., are measured by using the substrate stage PST, it is allowable, when a measurement stage is provided, to obtain the movement control accuracy (synchronization error, etc.,) of the measurement stage while moving the measurement stage in a state that the liquid immersion area is formed on the measurement stage, and to determine the exposure condition and based on the result of obtaining the movement control accuracy, etc.

Although the embodiments described above adopt the exposure apparatus in which the space between the projection optical system PL and the substrate P is locally filled with the liquid, the present invention is also applicable to a liquid immersion exposure apparatus which performs the exposure in a state in which the entire surface of the substrate as the exposure objective is immersed in the liquid as disclosed, for example, in Japanese Patent Application Laid-open Nos. 6-124873 and 10-303114 and U.S. Pat. No. 5,825,043. The structure and the exposure operation of such a liquid immersion exposure apparatus are described in detail, for example, in U.S. Pat. No. 5,825,043, contents of which are incorporated herein by reference within a range of permission of the domestic laws and ordinances of the state designated or selected in this international application.

As for the type of the exposure apparatus EX, the present invention is not limited to the exposure apparatus, for the semiconductor device production, which exposes the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

In the embodiments described above, the light-transmissive type mask, in which the predetermined shielding pattern (or the phase pattern or the dimming pattern) is formed on the light-transmissive substrate, is used. However, in place of the reticle, it is also allowable to use an electronic mask for forming a transmissive pattern, a reflective pattern, or a light emission pattern on the basis of the electronic data of the pattern to be subjected to the exposure, as disclosed, for example, in U.S. Pat. No. 6,778,257.

The present invention is also applicable to an exposure apparatus (lithography system) in which a line-and-space pattern is formed on a substrate P by forming interference fringes on the substrate P, as disclosed in the pamphlet of International Publication No. 2001/035168. Further, the present invention is also applicable to an exposure apparatus in which two mask patterns are synthesized on a wafer via a projection optical system and one shot area on the wafer is almost simultaneously double-exposed by one scanning exposure as disclosed in, for example, Published Japanese Translation of PCT International Publication for Patent Application No. 2004-519850 (corresponding to U.S. Pat. No. 6,611,316).

As described above, the exposure apparatus EX according to the embodiments of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 17:
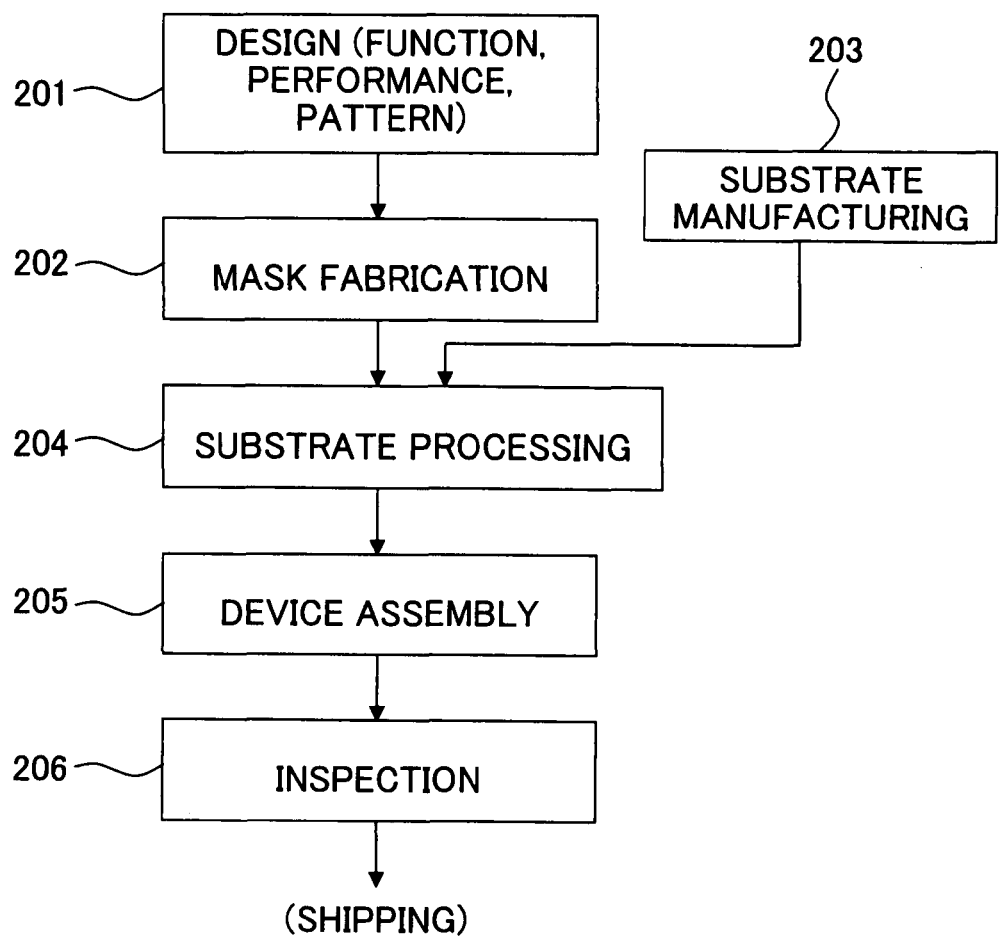
FIG. 17 is a flowchart showing an example of process for producing a micro device.

As shown in FIG. 17, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing (exposure process) step 204 of exposing the substrate with a pattern of the mask by using the exposure apparatus EX of the embodiments described above, a step 205 of assembling the device (including a dicing step, a bonding step, a packaging step and the like), and an inspection step 206.

INDUSTRIAL APPLICABILITY

According to the present invention, upon exposing a substrate held on a substrate stage while moving the substrate based on the liquid immersion method, the substrate can be satisfactorily exposed. Therefore, the present invention is very useful for an exposure apparatus for producing products in a wide range such as the semiconductor elements, liquid crystal display elements or displays, thin-film magnetic heads, CCDs, reticles (masks), and the like.

The invention claimed is:

1. An evaluation method for evaluating control accuracy of an exposure apparatus which has a substrate stage capable of moving a substrate and which exposes the substrate while moving the substrate with respect to an exposure light beam in a state that an optical path space for the exposure light beam is filled with a liquid, the method comprising:
measuring, before an exposure of the substrate, a first position information of the substrate while controlling the substrate stage to move the substrate stage in a state that the optical path space is filled with the liquid under a first liquid supply condition under which the liquid is supplied from a supply inlet of the exposure apparatus;
measuring, before the exposure of the substrate, a second position information of the substrate while controlling the substrate stage to move the substrate stage in a state that the optical path space is filled with the liquid under a second liquid supply condition under which the liquid is supplied from the supply inlet of the exposure apparatus, the second liquid supply condition being different from the first liquid supply condition;
evaluating movement control accuracy of the substrate stage based on a result of the measurement, the movement control accuracy being evaluated under the first liquid supply condition and the second liquid supply condition respectively prior to the exposure of the substrate; and
determining an optimal liquid supply amount per unit of time based upon the evaluation such that the movement control accuracy in the exposure is kept in a predetermined allowable range.

2. The evaluation method according to claim 1, wherein the substrate is exposed while synchronously moving the substrate stage and a mask stage, which is capable of moving a mask having a pattern, in a predetermined scanning direction; and
the movement control accuracy includes a synchronization error between the mask stage and the substrate stage.

3. The evaluation method according to claim 2, wherein the synchronization error is obtained based on rotation information of the substrate stage or the mask stage.

4. The evaluation method according to claim 2, wherein the substrate has a plurality of shot areas, and wherein the synchronization error is evaluated at a part of the shot areas.

5. The evaluation method according to claim 2, wherein the substrate has a plurality of shot areas, and wherein the synchronization error is evaluated at each of the shot areas.

6. The evaluation method according to claim 2, wherein the synchronization error is evaluated under a state in which the liquid is formed straddling a surface of the substrate and an upper surface of a member disposed around the substrate held on the substrate stage.

7. The evaluation method according to claim 2, wherein the optimal liquid supply amount per unit of time is determined in order to reduce the synchronization error between the mask stage and the substrate stage.

8. The evaluation method according to claim 2, wherein position information of each of the mask and the substrate is measured while moving the mask stage and the substrate stage in the scanning direction, and the synchronization error is obtained based on a result of the measurement.

9. The evaluation method according to claim 2, wherein a predetermined slit area on the mask is illuminated with the exposure light beam; and
at least one of an average of the synchronization error, in a period of time from an arbitrary point on the substrate enters into the slit area to the arbitrary point exits from the slit area, and a degree of dispersion around the average of the synchronization error is obtained based on the synchronization error.

10. The evaluation method according to claim 1, wherein the substrate stage is movable in a predetermined two-dimensional direction; and
the movement control accuracy includes movement control accuracy in the two-dimensional direction.

11. The evaluation method according to claim 1, wherein the substrate stage is movable in a predetermined two-dimensional direction; and
the movement control accuracy includes movement control accuracy in a direction perpendicular to the two-dimensional direction.

12. The evaluation method according to claim 11, wherein the movement control accuracy in the direction perpendicular to the two-dimensional direction includes a position error between a predetermined surface on the substrate stage and a target surface with which the predetermined surface is to be matched.

13. The evaluation method according to claim 12, wherein the predetermined surface includes at least one of a surface of the substrate held on the substrate stage and a surface of a member disposed around the substrate held on the substrate stage.

14. The evaluation method according to claim 12, wherein the target surface is determined based on an image plane formed via a projection optical system and the liquid.

15. The evaluation method according to claim 1, further comprising:
measuring, before an exposure of the substrate, position information of the substrate while controlling the substrate stage to move the substrate stage in a state that the optical path space is filled with the liquid under a predetermined condition,
wherein the predetermined condition includes at least one of a liquid immersion condition for filling the optical path space with the liquid, a moving condition of the substrate, a condition of an object which comes into contact with the liquid, and a blowing condition for blowing a gas toward the optical path space from an outer side of the optical path space, the liquid immersion condition including the liquid supply condition.

16. The evaluation method according to claim 1, wherein the first liquid supply condition and the second liquid supply condition include a liquid supply amount per unit time.

17. The evaluation method according to claim 16, wherein the first liquid supply condition and the second liquid supply condition include a position from which the liquid is supplied.

18. The evaluation method according to claim 1, wherein the exposure apparatus has a projection optical system and a member having a lower surface which surrounds the optical path space and a supply inlet provided on the lower surface;
the substrate stage moves under the projection optical system in a state that a space between the lower surface of the member and the substrate is filled with the liquid; and
the liquid is retained between the lower surface of the member and the substrate in the measurement of the first position information of the substrate and the measurement of the second position information of the substrate.

19. An evaluation method for evaluating control accuracy of an exposure apparatus which has a substrate stage capable of moving a substrate and which exposes the substrate while moving the substrate with respect to an exposure light beam in a state that an optical path space for the exposure light beam is filled with a liquid, the method comprising:
measuring, before an exposure of the substrate, a first position information of the substrate while controlling the substrate stage to move the substrate stage in a state that the optical path space is filled with the liquid under a first liquid recovery condition under which the liquid is recovered from a recovery outlet of the exposure apparatus;
measuring, before the exposure of the substrate, a second position information of the substrate while controlling the substrate stage to move the substrate stage in a state that the optical path space is filled with the liquid under a second liquid recovery condition under which the liquid is recovered from the recovery outlet of the exposure apparatus, the second liquid recovery condition being different from the first liquid recovery condition;
evaluating movement control accuracy of the substrate stage based on a result of the measurement, the movement control accuracy being evaluated under the first liquid recovery condition and the second liquid recovery condition respectively prior to exposure of the substrate; and
determining an optimal liquid recovery amount per unit of time based upon the evaluation such that the movement control accuracy in the exposure is kept in a predetermined allowable range.

20. The evaluation method according to claim 19, wherein the first liquid recovery condition and the second liquid recovery condition include a liquid recovery amount per unit time.

21. The evaluation method according to claim 20, wherein the recovery outlet recovers only the liquid.

22. The evaluation method according to claim 19, wherein the liquid is recovered from the recovery outlet together with a gas.

23. The evaluation method according to claim 22, wherein the first liquid recovery condition and the second liquid recovery condition include a ratio of the liquid and the gas.

24. The evaluation method according to claim 19, wherein the first liquid recovery condition and the second liquid recovery condition include a position from which the liquid is recovered.

25. The evaluation method according to claim 19, wherein the substrate is exposed while synchronously moving the substrate stage and a mask stage, which is capable of moving a mask having a pattern, in a predetermined scanning direction; and
the movement control accuracy includes a synchronization error between the mask stage and the substrate stage.

26. The evaluation method according to claim 25, wherein the synchronization error is obtained based on rotation information of the substrate stage or the mask stage.

27. The evaluation method according to claim 25, wherein the substrate has a plurality of shot areas, and wherein
the synchronization error is evaluated at a part of the shot areas.

28. The evaluation method according to claim 25, wherein the substrate has a plurality of shot areas, and wherein
the synchronization error is evaluated at each of the shot areas.

29. The evaluation method according to claim 25, wherein the synchronization error is evaluated under a state in which the liquid is formed straddling a surface of the substrate and an upper surface of a member disposed around the substrate held by the substrate stage.

30. The evaluation method according to claim 25, wherein the optimal liquid recovery amount per unit of time is determined in order to reduce the synchronization error between the mask stage and the substrate stage.

31. The evaluation method according to claim 25, wherein position information of each of the mask and the substrate is measured while moving the mask stage and the substrate stage in the scanning direction, and the synchronization error is obtained based on a result of the measurement.

32. The evaluation method according to claim 25, wherein
a predetermined slit area on the mask is illuminated with the exposure light beam; and
at least one of an average of the synchronization error, in a period of time from an arbitrary point on the substrate enters into the slit area to the arbitrary point exits from the slit area, and a degree of dispersion around the average of the synchronization error is obtained based on the synchronization error.

33. The evaluation method according to claim 19,
wherein the substrate stage is movable in a predetermined two-dimensional direction; and
the movement control accuracy includes movement control accuracy in the two-dimensional direction.

34. The evaluation method according to claim 19, wherein
the substrate stage is movable in a predetermined two-dimensional direction; and
the movement control accuracy includes movement control accuracy in a direction perpendicular to the two-dimensional direction.

35. The evaluation method according to claim 34, wherein the movement control accuracy in the direction perpendicular to the two-dimensional direction includes a position error between a predetermined surface on the substrate stage and a target surface with which the predetermined surface is to be matched.

36. The evaluation method according to claim 35, wherein the predetermined surface includes at least one of a surface of the substrate held on the substrate stage and a surface of a member disposed around the substrate held on the substrate stage.

37. The evaluation method according to claim 35, wherein the target surface is determined based on an image plane formed via a projection optical system and the liquid.

38. The evaluation method according to claim 19, further comprising:
measuring, before an exposure of the substrate, position information of the substrate while controlling the substrate stage to move the substrate stage in a state that the optical path space is filled with the liquid under a predetermined condition,
wherein the predetermined condition includes at least one of a liquid immersion condition for filling the optical path space with the liquid, a moving condition of the substrate, a condition of an object which comes into contact with the liquid, and a blowing condition for blowing a gas toward the optical path space from an outer side of the optical path space, the liquid immersion condition including the liquid recovery condition.

39. The evaluation method according to claim 19, wherein
the exposure apparatus has a projection optical system and a member having a lower surface which surrounds the optical path space and a supply inlet provided on the lower surface;
the substrate stage moves under the projection optical system in a state that a space between the lower surface of the member and the substrate is filled with the liquid; and
the liquid is retained between the lower surface of the member and the substrate in the measurement of the first position information of the substrate and the measurement of the second position information of the substrate.

40. An evaluation method for evaluating control accuracy of an exposure apparatus which has a substrate stage capable of moving a substrate and which exposes the substrate while moving the substrate with respect to an exposure light beam in a state that an optical path space for the exposure light beam is filled with a liquid, the method comprising:
measuring, before an exposure of the substrate, a first position information of the substrate while controlling the substrate stage to move the substrate stage in a state that the optical path space is filled with the liquid under a first blowing condition for blowing a gas from a gas blow port;
measuring, before the exposure of the substrate, a second position information of the substrate while controlling the substrate stage to move the substrate stage in a state that the optical path space is filled with the liquid under a second blowing condition for blowing a gas from the gas blow port, the second blowing condition being different from the first blowing condition;
evaluating movement control accuracy of the substrate stage based on a result of the measurement, the movement control accuracy being evaluated under the first blowing condition and the second blowing condition respectively prior to exposure of the substrate; and
determining an optimal blowing amount per unit of time based upon the evaluation such that the movement control accuracy in the exposure is kept in a predetermined allowable range.

41. The evaluation method according to claim 40, wherein the first blowing condition and the second blowing condition include a gas blowing amount per unit time.

42. The evaluation method according to claim 40, wherein the first blowing condition and the second blowing condition include a gas blowing direction.

43. The evaluation method according to claim 40, wherein
the substrate is exposed while synchronously moving the substrate stage and a mask stage, which is capable of moving a mask having a pattern, in a predetermined scanning direction; and
the movement control accuracy includes a synchronization error between the mask stage and the substrate stage.

44. The evaluation method according to claim 43, wherein the synchronization error is obtained based on rotation information of the substrate stage or the mask stage.

45. The evaluation method according to claim 43, wherein
the substrate has a plurality of shot areas, and wherein
the synchronization error is evaluated at a part of the shot areas.

46. The evaluation method according to claim 43, wherein
the substrate has a plurality of shot areas, and wherein
the synchronization error is evaluated at each of the shot areas.

47. The evaluation method according to claim 43, wherein the synchronization error is evaluated under a state in which the liquid is formed straddling a surface of the substrate and an upper surface of a member disposed around the substrate held by the substrate stage.

48. The evaluation method according to claim 43, wherein the optimal blowing amount per unit of time is determined in order to reduce the synchronization error between the mask stage and the substrate stage.

49. The evaluation method according to claim 43, wherein position information of each of the mask and the substrate is measured while moving the mask stage and the substrate stage in the scanning direction, and the synchronization error is obtained based on a result of the measurement.

50. The evaluation method according to claim 43, wherein a predetermined slit area on the mask is illuminated with the exposure light beam; and
at least one of an average of the synchronization error, in a period of time from an arbitrary point on the substrate enters into the slit area to the arbitrary point exits from the slit area, and a degree of dispersion around the average of the synchronization error is obtained based on the synchronization error.

51. The evaluation method according to claim 40, wherein the substrate stage is movable in a predetermined two-dimensional direction; and
the movement control accuracy includes movement control accuracy in the two-dimensional direction.

52. The evaluation method according to claim 40, wherein the substrate stage is movable in a predetermined two-dimensional direction; and
the movement control accuracy includes movement control accuracy in a direction perpendicular to the two-dimensional direction.

53. The evaluation method according to claim 52, wherein the movement control accuracy in the direction perpendicular to the two-dimensional direction includes a position error between a predetermined surface on the substrate stage and a target surface with which the predetermined surface is to be matched.

54. The evaluation method according to claim 53, wherein the predetermined surface includes at least one of a surface of the substrate held on the substrate stage and a surface of a member disposed around the substrate held on the substrate stage.

55. The evaluation method according to claim 53, wherein the target surface is determined based on an image plane formed via a projection optical system and the liquid.

56. The evaluation method according to claim 40, further comprising:
measuring, before an exposure of the substrate, position information of the substrate while controlling the substrate stage to move the substrate stage in a state that the optical path space is filled with the liquid under a predetermined condition,
wherein the predetermined condition includes at least one of a liquid immersion condition for filling the optical path space with the liquid, a moving condition of the substrate, a condition of an object which comes into contact with the liquid.

57. The evaluation method according to claim 40, wherein
the exposure apparatus has a projection optical system and a member having a lower surface which surrounds the optical path space and a supply inlet provided on the lower surface;

the substrate stage moves under the projection optical system in a state that a space between the lower surface of the member and the substrate is filled with the liquid; and, the liquid is retained between the lower surface of the member and the substrate in the measurement of the first position information of the substrate and the measurement of the second position information of the substrate.

58. An adjusting method used in an exposure apparatus having a projection optical system, a substrate stage capable of moving a substrate, and a supply inlet which supplies a liquid to a space under the projection optical system, the exposure apparatus exposing the substrate while moving the substrate with respect to an exposure light beam in a state that the space is filled with the liquid, the method comprising:

measuring a position information of the substrate stage while supplying the liquid to the space via the supply inlet and while controlling the substrate stage to move in a state that an optical path space of the exposure light beam is filled with the liquid; and adjusting a supply amount of the liquid to be supplied via the supply inlet such that a movement control accuracy of the substrate stage is kept in a predetermined allowable range.

59. An adjusting method used in an exposure apparatus having a projection optical system, a substrate stage capable of moving a substrate, and a recovery outlet which recovers a liquid from a space under the projection optical system, the exposure apparatus exposing the substrate while moving the substrate with respect to an exposure light beam in a state that the space is filled with the liquid, the method comprising:

measuring a position information of the substrate stage while recovering the liquid from the space via the recovery outlet and while controlling the substrate stage to move in a state that an optical path space of the exposure light beam is filled with the liquid; and adjusting a recovery amount of the liquid recovered from the space via the recovery outlet such that a movement control accuracy of the substrate stage is kept in a predetermined allowable range.

60. An adjusting method used in an exposure apparatus having a projection optical system, a substrate stage capable of moving a substrate, and a gas blow port which blows a gas, the exposure apparatus exposing the substrate while moving the substrate with respect to an exposure light beam in a state that the space is filled with a liquid, the method comprising:

measuring a position information of the substrate stage while blowing the gas via the gas blow port and while controlling the substrate stage to move in a state that an optical path space of the exposure light beam is filled with the liquid; and adjusting a blowing amount of the gas blown via the gas blow port such that a movement control accuracy of the substrate stage is kept in a predetermined allowable range.

* * * * *